(12) United States Patent
Sakamoto

(10) Patent No.: US 6,683,810 B2
(45) Date of Patent: *Jan. 27, 2004

(54) NON-VOLATILE MEMORY AND METHOD OF NON-VOLATILE MEMORY PROGRAMMING

(75) Inventor: Yoshinori Sakamoto, Ome (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/270,057

(22) Filed: Oct. 15, 2002

(65) Prior Publication Data

US 2003/0053356 A1 Mar. 20, 2003

Related U.S. Application Data

(63) Continuation of application No. 09/810,508, filed on Mar. 19, 2001, now Pat. No. 6,490,201.

(30) Foreign Application Priority Data

Sep. 28, 2000 (JP) ........................................ 2000-296023

(51) Int. Cl.$^7$ .............................................. G11C 16/06
(52) U.S. Cl. ............................ 365/185.22; 365/185.03; 365/185.19
(58) Field of Search ........................ 365/185.22, 185.03, 365/185.19, 185.26, 185.33, 185.23, 185.24, 185.18

(56) References Cited

U.S. PATENT DOCUMENTS

| 5,467,309 | A | | 11/1995 | Tanaka et al. | 365/185.14 |
| 5,682,346 | A | | 10/1997 | Yamamura et al. | 365/185.18 |
| 5,784,316 | A | | 7/1998 | Hirata | 365/185.22 |
| 5,959,882 | A | | 9/1999 | Yoshida et al. | 365/185.03 |
| 6,038,167 | A | * | 3/2000 | Miwa et al. | 365/185.03 |
| 6,490,201 | B2 | * | 12/2002 | Sakamoto | 365/185.22 |

FOREIGN PATENT DOCUMENTS

| JP | 3-130995 | 6/1991 |
| JP | 9-55092 | 2/1997 |

* cited by examiner

Primary Examiner—David Lam
(74) Attorney, Agent, or Firm—Miles & Stockbridge P.C.

(57) ABSTRACT

A non-volatile memory has a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information. A write control circuit for controlling the electric charges accumulated at the floating gates by performing a verify operation, after performing a write operation in a prescribed write quantity on the memory elements, carries out one or more each of search write operations, set to a smaller write quantity than the prescribed write quantity at the time of start of writing, and verify operations matching thereto.

4 Claims, 24 Drawing Sheets

ERASE

DEPLETE PREVENTION PROCESSING

PULSE WIDTH CONSTANT AT 100 μs

APPLICATION TIME TN ON DEFECTIVE BIT AFTER DEFECTIVE BIT FOLLOWING N-TH VERIFY

TN = 1.2 × (TN−1 CUMULATIVE DURATION) − (TN−1 CUMULATIVE DURATION)

NON-VOLATILE MEMORY AND METHOD OF NON-VOLATILE MEMORY PROGRAMMING

CROSS-REFERENCE TO RELATED APPLICATION

This application is a continuation of Application No. 09/810,508 filed Mar. 19, 2001 now U.S. Pat. No. 6,490,201.

BACKGROUND OF THE INVENTION

The present invention relates to a non-volatile memory and a method of non-volatile memory programming, and more particularly to a technique that can be effectively utilized for a write verifying operation in a flash memory or the like wherein electrical write erasion is made possible.

A non-volatile memory cell, such as a flash EEPROM (hereinafter to be referred to merely as "flash memory"), as illustrated in FIG. 24, has a diffusion layer comprising a source and a drain and a stacked structure into which a floating gate and a control gate are configured over a semiconductor-substrate between the source and the drain via a gate insulating film, wherein the control gate is connected to a word line, the drain, to a bit line (or a data line), the source, to a source line. The write operation can be broadly classified into an FN (Fowler Nordheim) tunnel write type by which a high voltage, such as 18.1 V, is applied to the control gate and an electron FN tunnel current is let flow from a channel to the floating gate via the gate insulating film to accumulate electric charges, and a channel hot electron type by which hot electrons generated by a current flowing between the source and the drain are accumulated at the floating gate.

The present inventors earlier developed a multi-value type flash memory. In this multi-value memory, it is necessary to make four threshold voltage (hereinafter to be abbreviated to Vth) distributions matching two bits (four values) each of memory cells. In doing so, processing for band narrowing to write each distribution in a certain separate range is required to ensure reliability of data conservation. In order to accomplish such write operations for such band narrowing, write operations and verify operations are carried out with write pulses (PULSE 0 through 5 . . . ) which are intended to make the variant Vth of the threshold voltage per write operation smaller than the difference between the threshold voltages as shown in FIG. 25, so that the Vth of the memory cell reach the desired threshold voltage range by a plurality each of write operations and verify operations.

Incidentally, a search after the accomplishment of the invention under the present application revealed that examples of floating memory in which the voltage of the write pulses is raised stepwise or the pulse width increased are found in the Japanese Published Unexamined Patent Application No. Hei 9(1997)-55092, the Japanese Published Unexamined Patent Application No. Hei 7 (1995)-73685 (U.S. Pat. No. 5,467,309) and the Japanese Published Unexamined Patent Application No. Hei 3(1991)-130995 (U.S. patent application Ser. No. 89/367,597). However, none of these examples of the prior art makes any mention of the presence of memory cells which deviate from their inherent characteristics and are suddenly excessively written into, as will be described below.

In designing the Vth distributions, margins are allowed for various coefficients of dependence (including Vcc, temperature, write characteristics, erase characteristics and deterioration due to rewriting). However, there are memory cells which, as rewriting into them is repeated, deviate from their inherent characteristics and are suddenly excessively written into. In the present application, such memory cells will be referred to as erratically written memory cells, or simply erratic cells, because they may return to their original characteristics after erasion following such sudden excess writing and this phenomenon is not highly reproducible. Such erratic cells require erasion of the excessively written state and rewriting and, if the rewriting into some sectors can be done normally, those sectors will be considered good ones or, if not, they will be treated as faulty sectors thereafter.

Such erratic cells, because of the low reproducibility, may return to normalcy after only one round of erasion, or may not even after repeated writing and erasion Therefore, it seems most rational, with the duration of writing and the frequency of fault occurrence taken into account, to regard the sectors which permit normal writing after a single round of erasion as being good ones and those which do not as faulty sectors and to write the same data into other sectors. However, even if the sectors permitting normal writing after a single round of erasion are regarded as being good ones, an increase in the duration of writing is unavoidable, and disqualifying those that require two or more rounds of erasion would result in an increased frequency of fault occurrence. Relief by rewriting into another sector after determining a faulty sector or sectors would involve the problem of increasing the burden on the user and corresponding inconvenience.

SUMMARY OF THE INVENTION

An object of the present invention is to provide a non-volatile memory and a method of non-volatile memory programming realizing stable write operations. Another object of the invention is to provide a non-volatile memory and a method of non-volatile memory programming reduced in the frequency of fault occurrence and improved in the convenience of use while shortening the substantial length of time required for writing. These and other objects and novel features of the invention will become more apparent for the following description in this specification when taken in conjunction with the accompanying drawings.

To briefly describe a typical aspect of the invention disclosed in this application, there is provided a non-volatile memory having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information, wherein a write control circuit for controlling the electric charges accumulated at the floating gates by performing a verify operation, after performing a write operation in a prescribed write quantity on the memory elements, carries out one or more each of search write operations, set to a smaller write quantity than the prescribed write quantity at the time of start of writing, and verify operations matching thereto.

To briefly describe another typical aspect of the invention disclosed in this application, there is provided a method of non-volatile memory programming for non-volatile memories each having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information whereby one or more each of search write operations, set to a smaller write quantity than a prescribed write quantity at the time of start of writing, and verify operations matching thereto are performed, write operation control is so set as to perform a write operation set to the prescribed write quantity and a verify operation matching thereto after the plurality each of search write operations and verify operations, and the write operation is ended if it is so determined that the verify operation has caused a threshold voltage matching the electric charges of the floating gates of the memory elements to reach a desired threshold voltage.

BRIEF DESCRIPTION OF THE INVENTION

Figure 6A:
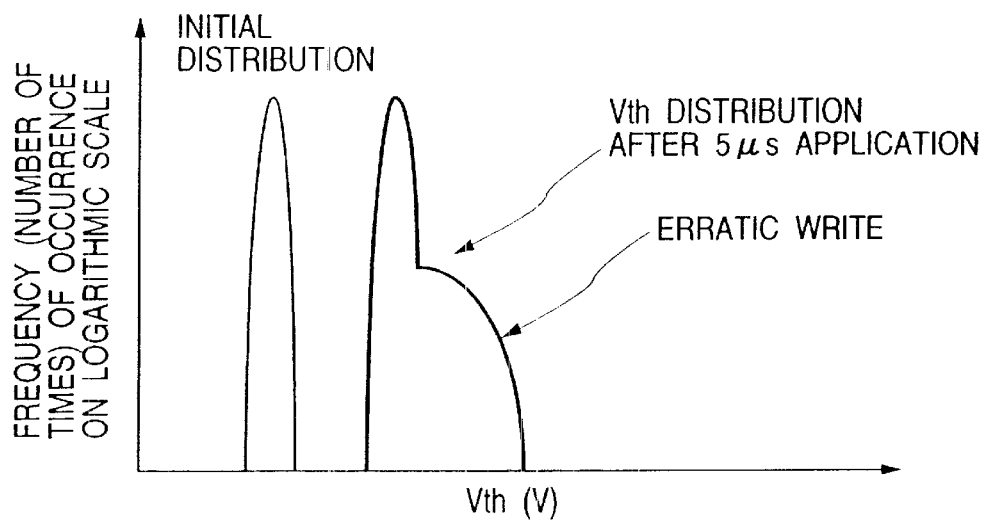
Figure 6B:
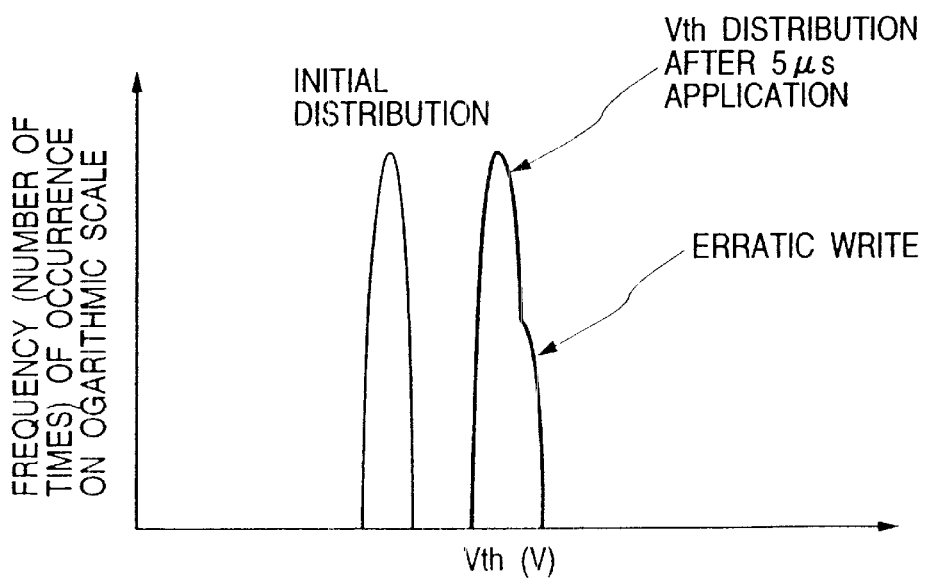

FIGS. 6(A) and 6(B) are another pair of characteristics diagrams for describing the write characteristics of the non-volatile memory according to the invention.

Figure 7:
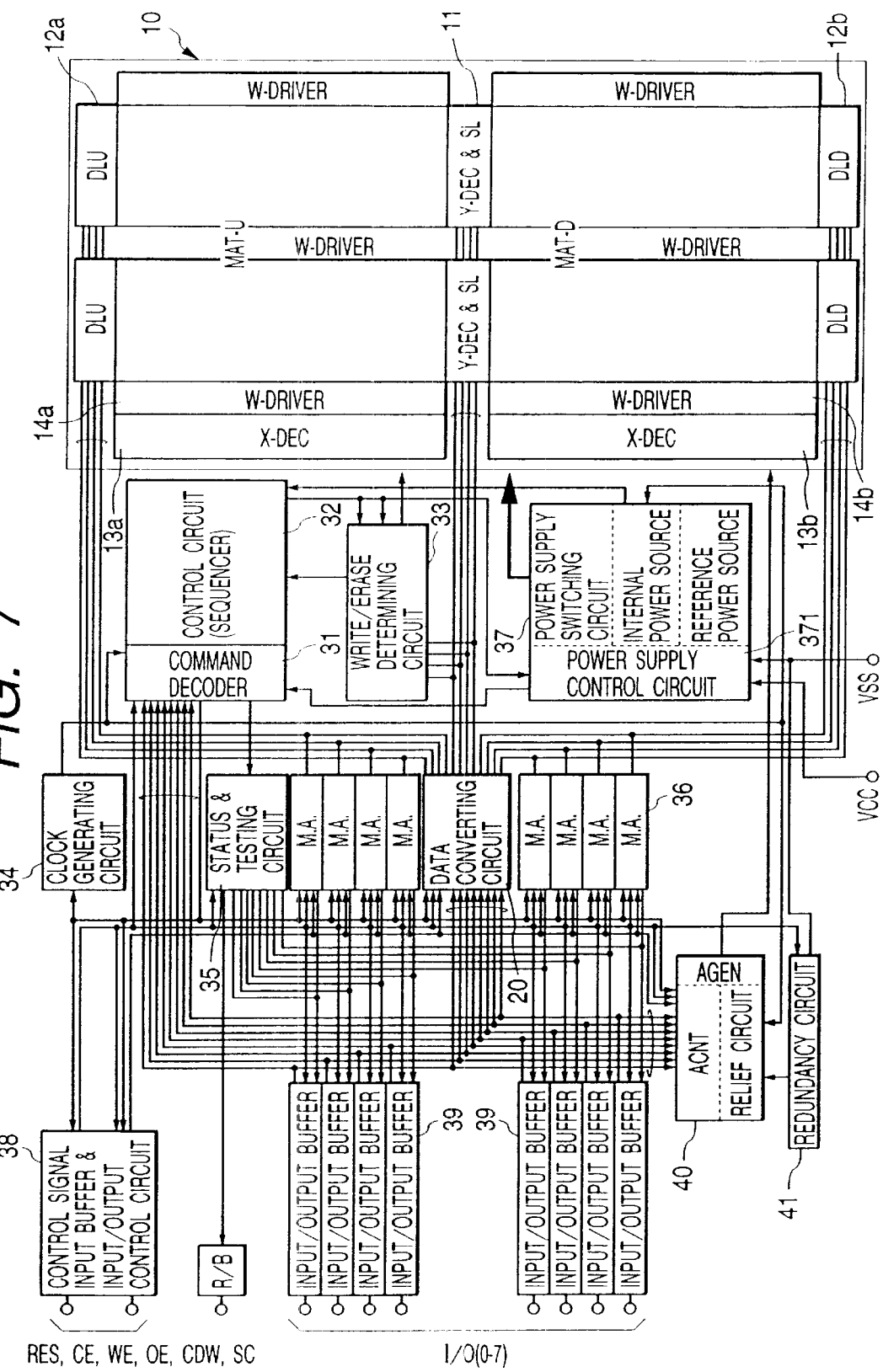

FIG. 7 is a block diagram of a non-volatile memory, which is an embodiment of the present invention.

Figure 8:
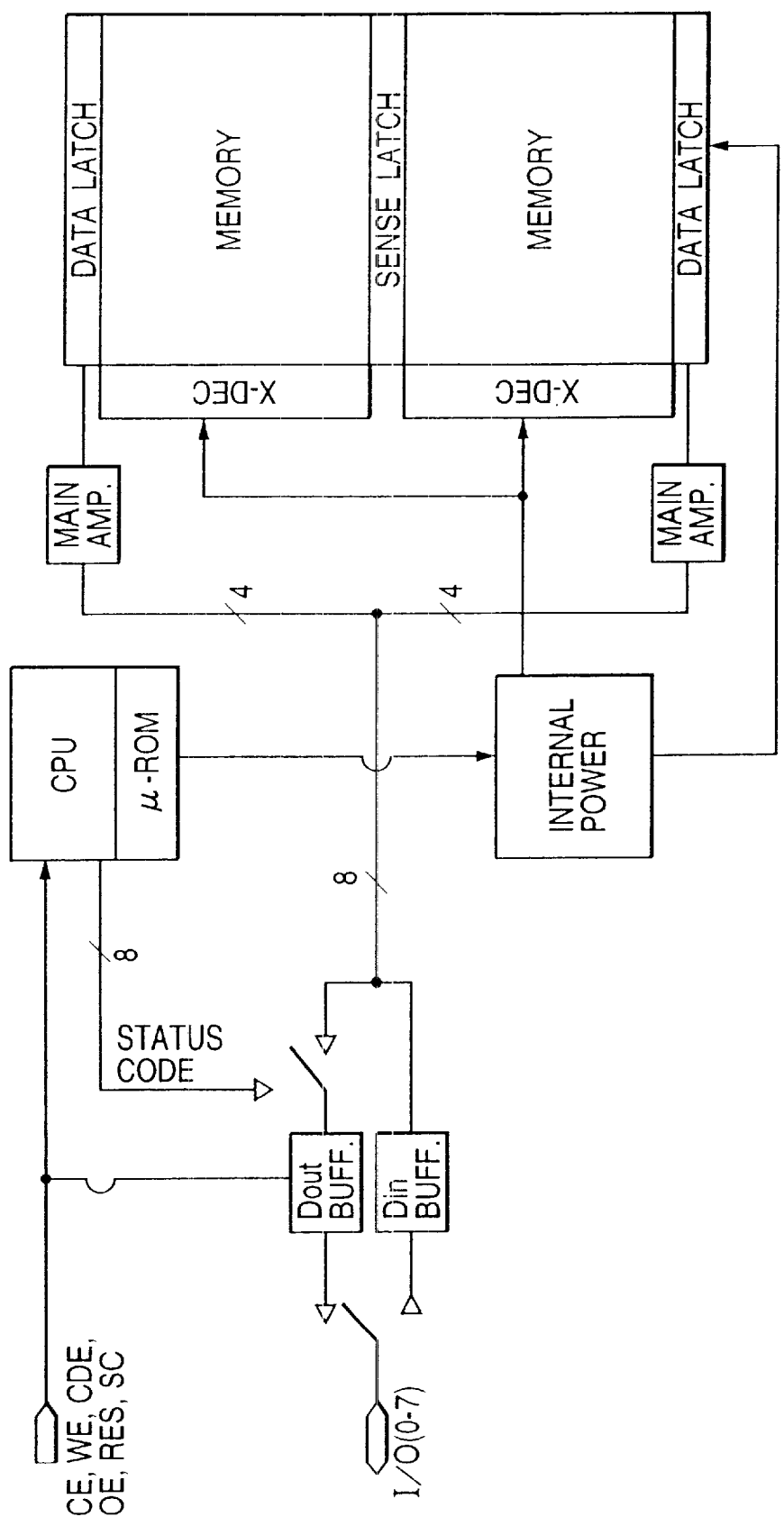

FIG. 8 is a block diagram of a non-volatile memory embodying the present invention in another way.

Figure 9:
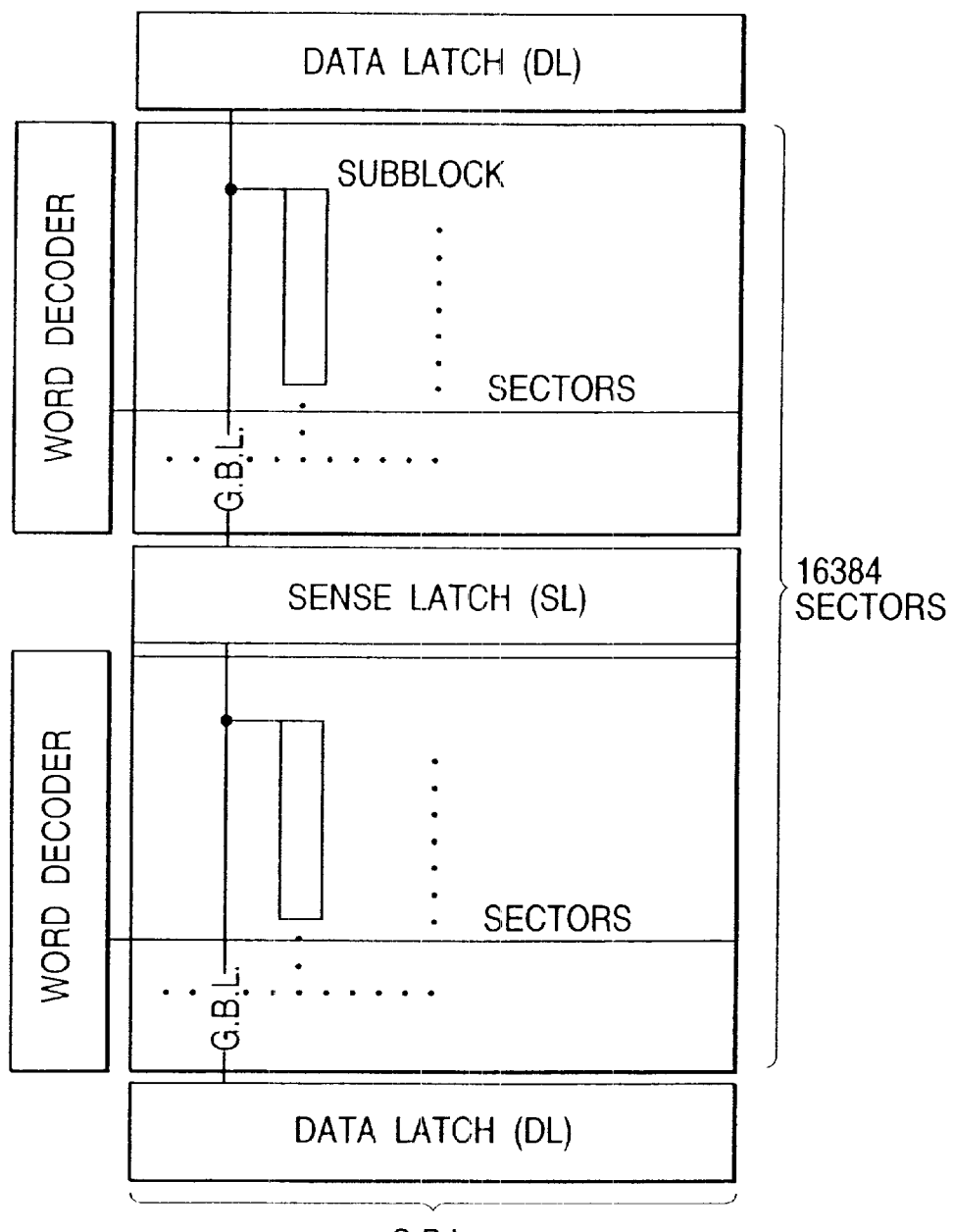

FIG. 9 is a block diagram illustrating one example of a memory array mat section of the non-volatile memory according to the invention.

Figure 10:
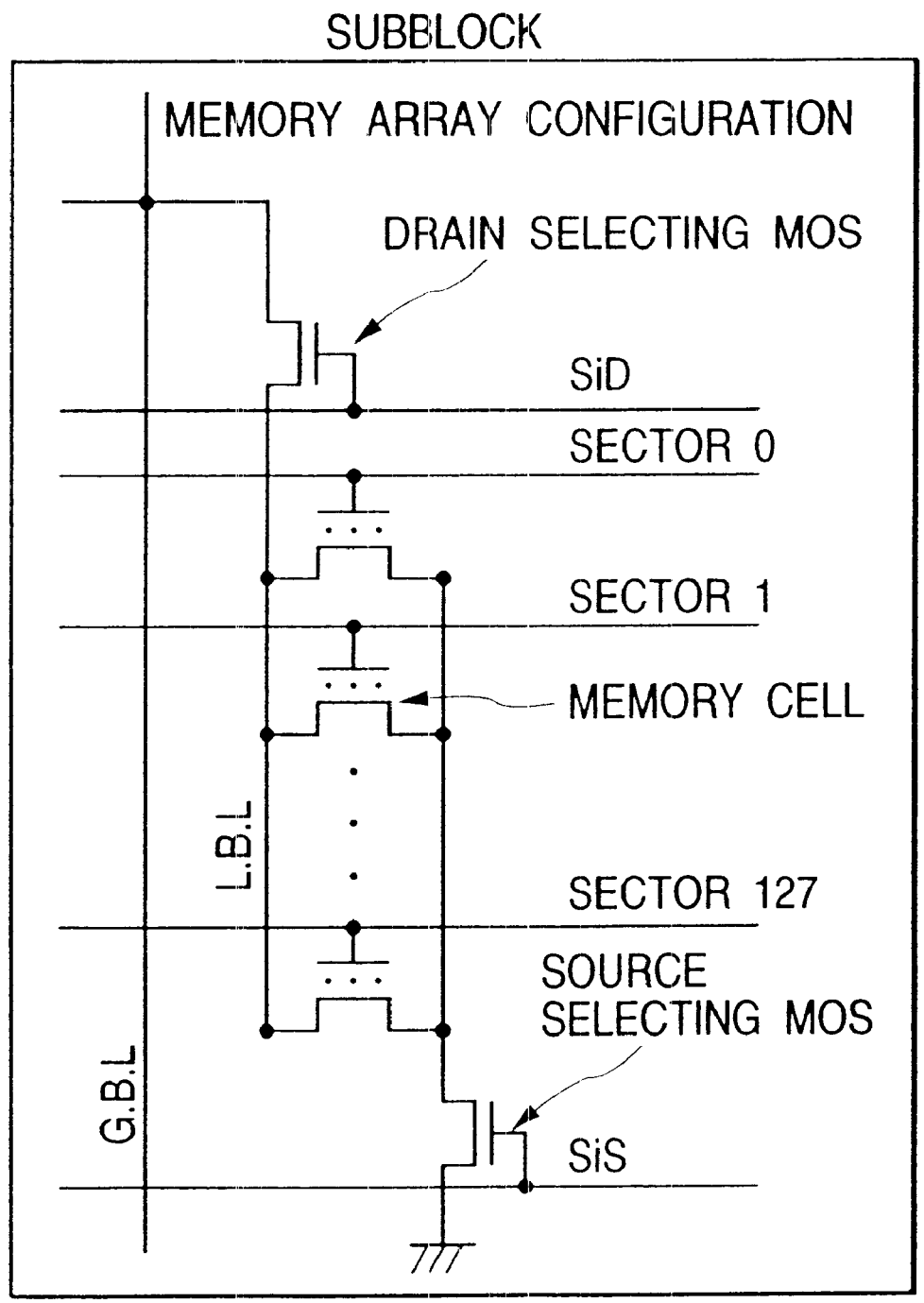

FIG. 10 is a circuit diagram illustrating one example of subblock in FIG. 9.

Figure 11A:
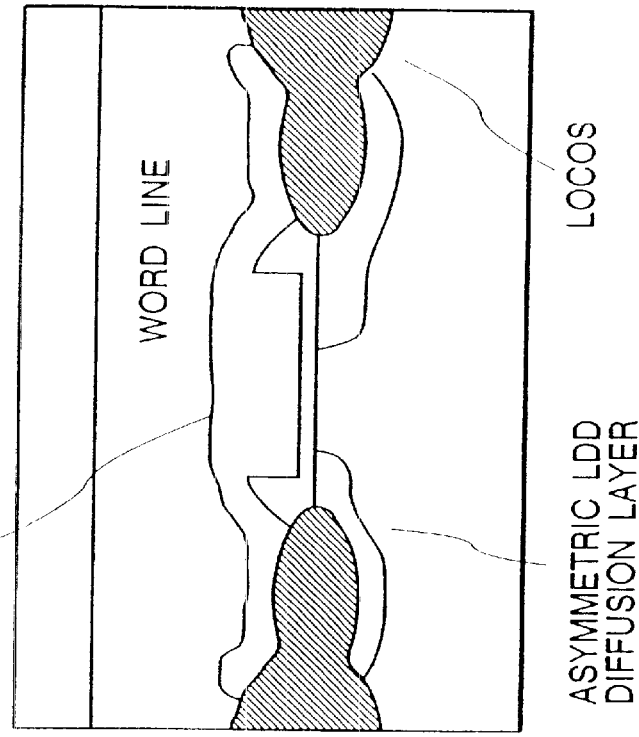
Figure 11B:
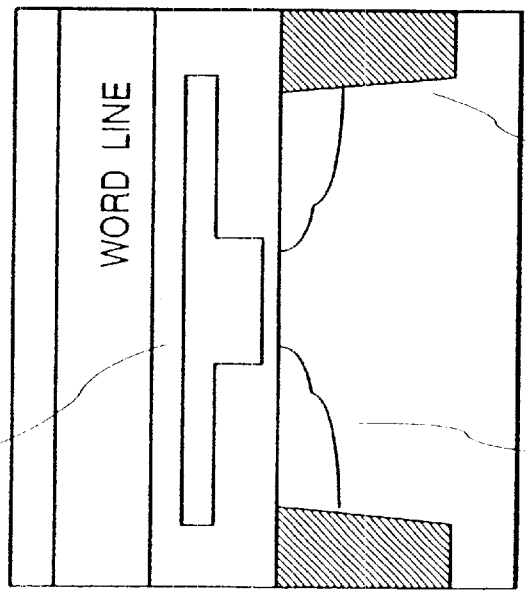

FIGS. 11A and 11B show schematic cross-sections of element structures in storage transistors used in a non-volatile memory in accordance with an embodiment of the invention.

Figure 12:
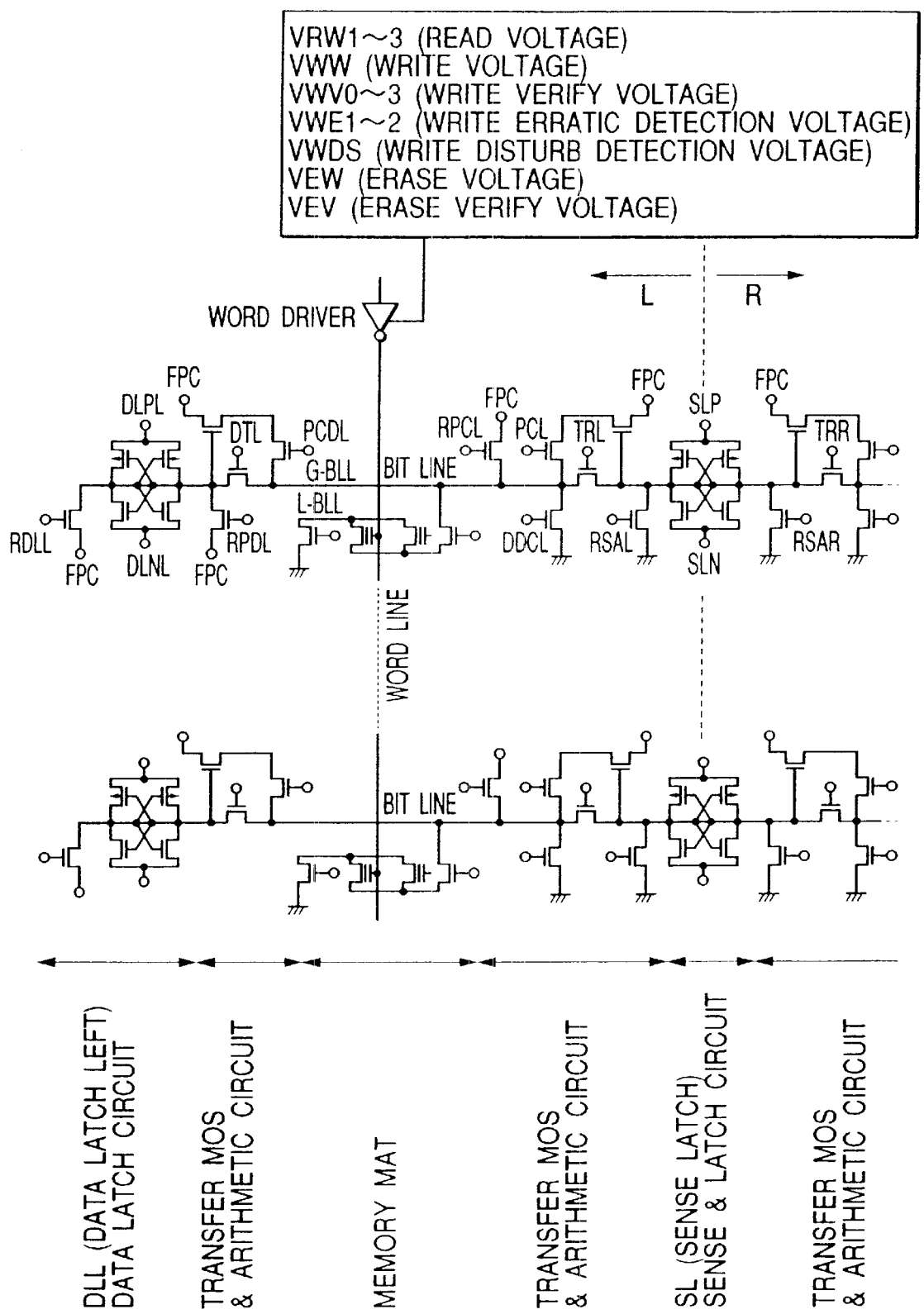

FIG. 12 is a circuit diagram illustrating an example of a memory array section centering on a sense latch circuit SL of a non-volatile memory embodying the invention.

Figure 13:
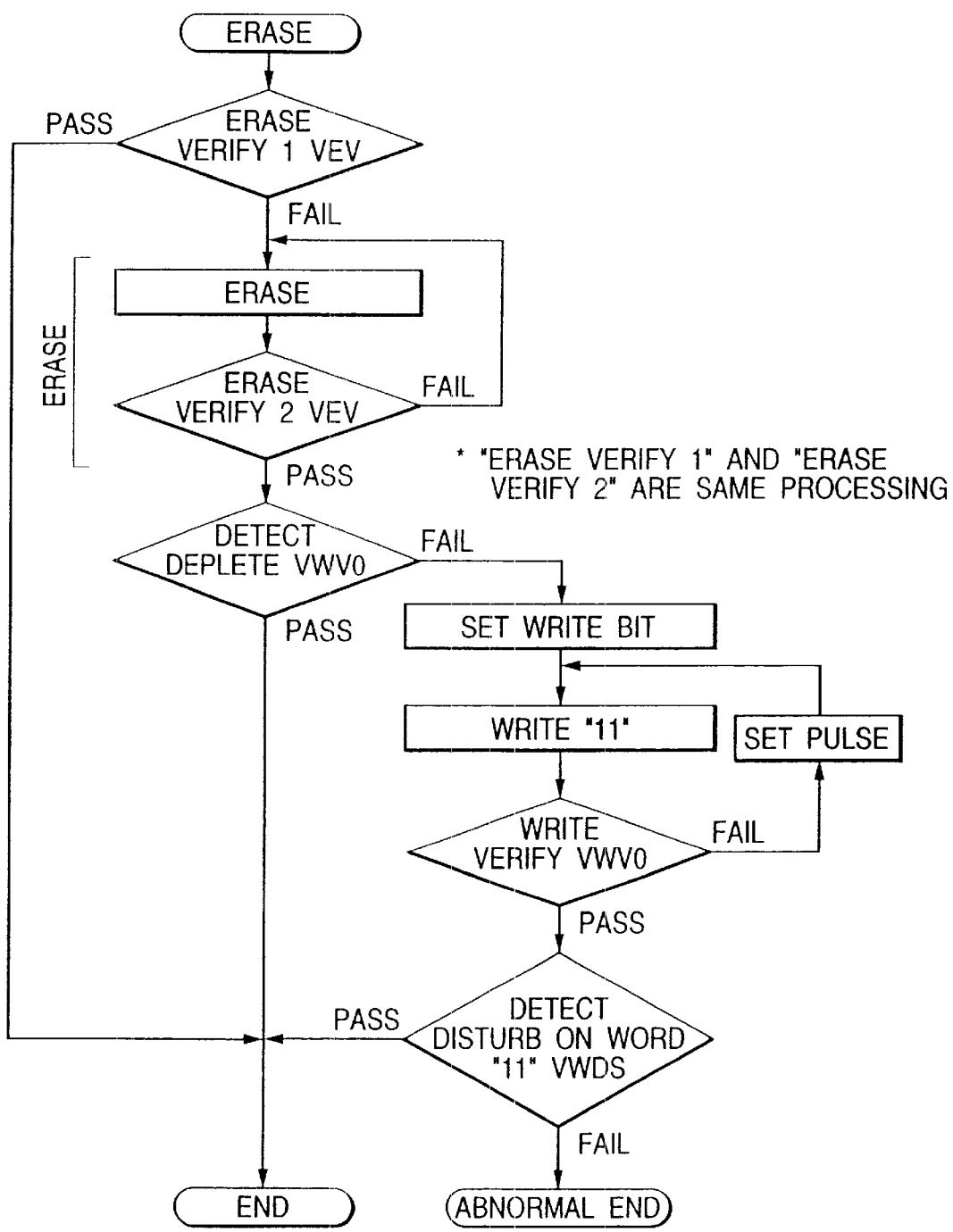

FIG. 13 is a flow chart for describing an erase operation in a non-volatile memory embodying the invention.

Figure 14A:
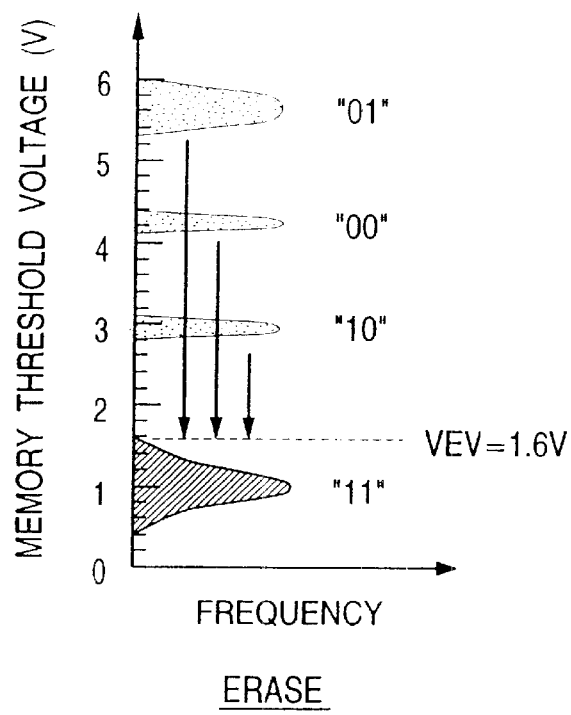
Figure 14B:
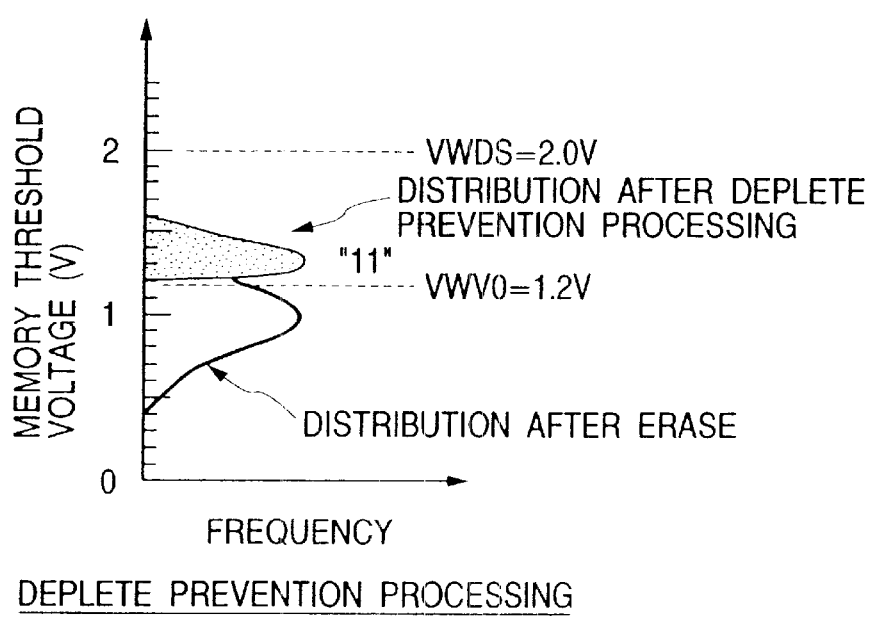

FIGS. 14(A) and 14(B) are distribution diagrams of threshold voltages in the erase operation of FIG. 13.

Figure 15:
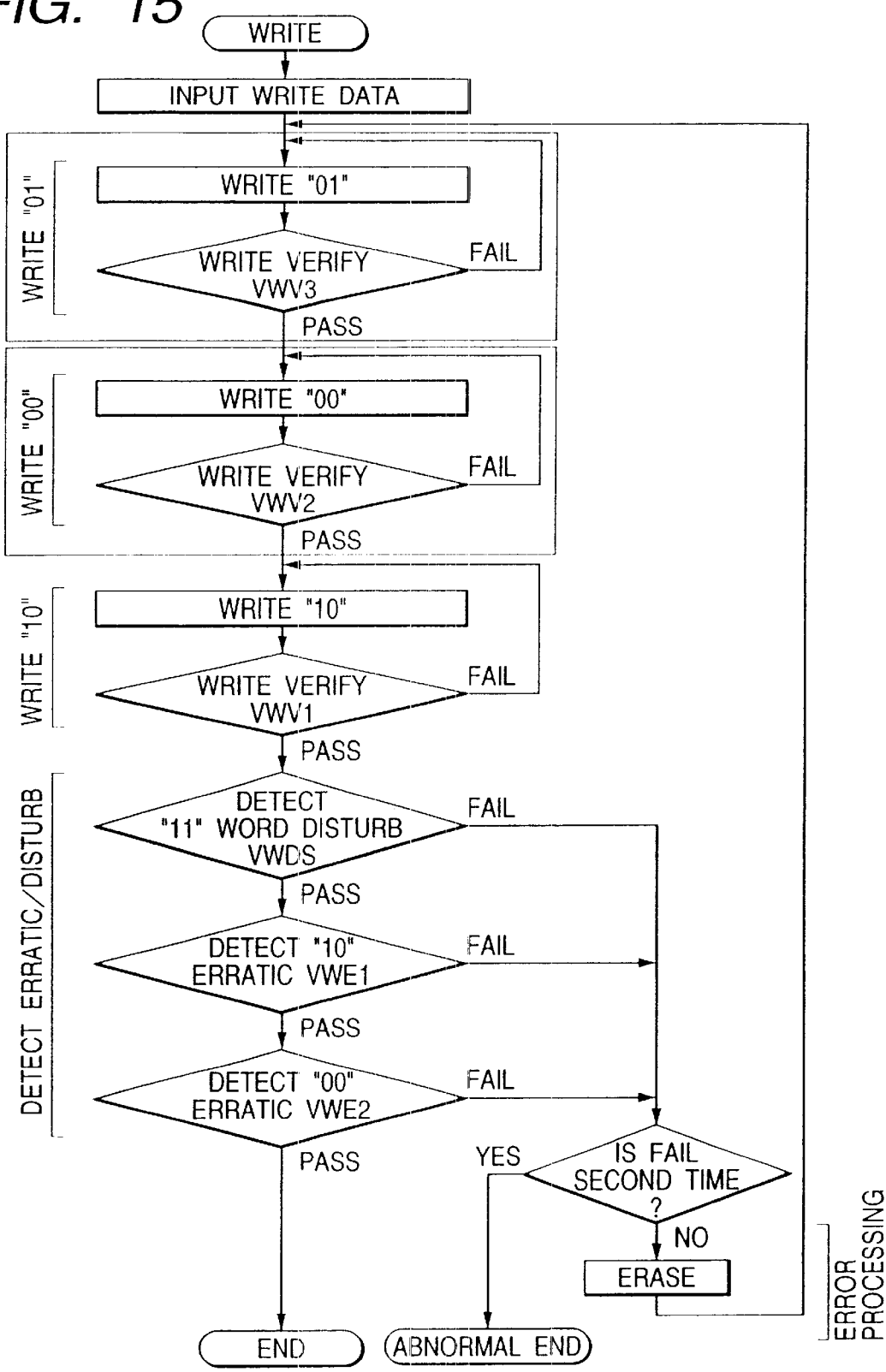

FIG. 15 is an overall flow chart for describing a write operation in the non-volatile memory embodying the invention.

Figure 16A:
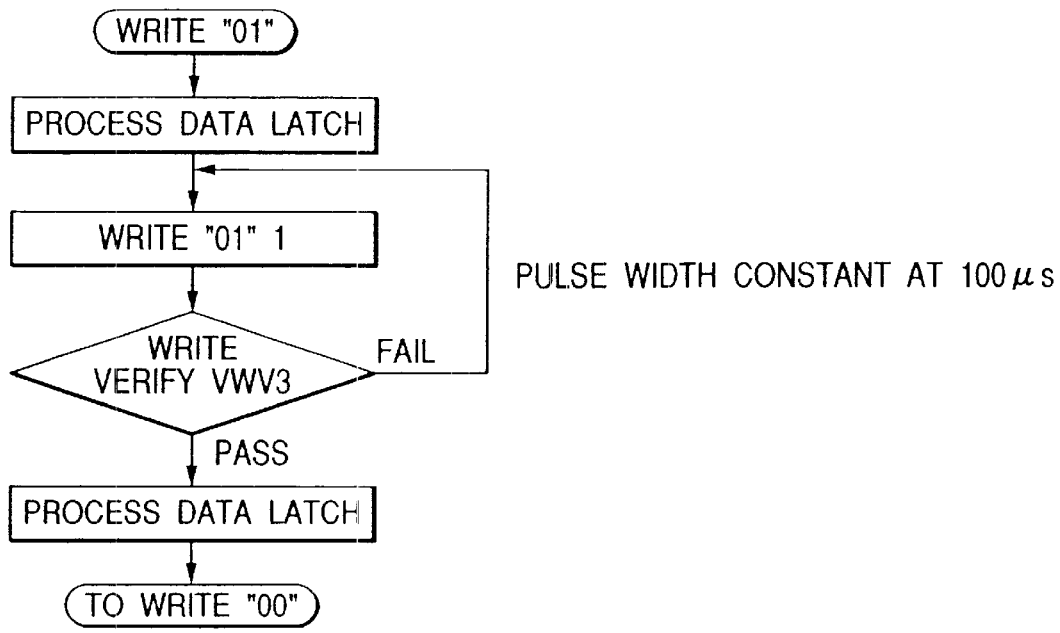
Figure 16B:
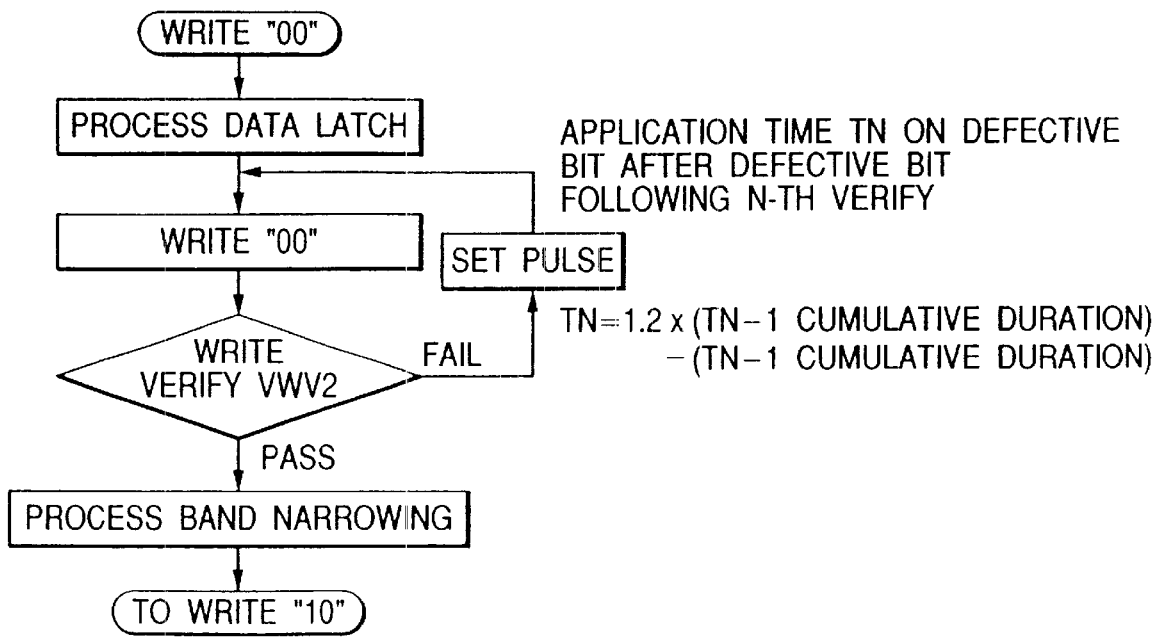

FIGS. 16(A) and 16(B) are partial flow charts for describing the write operation in the non-volatile memory embodying the invention.

Figure 17:
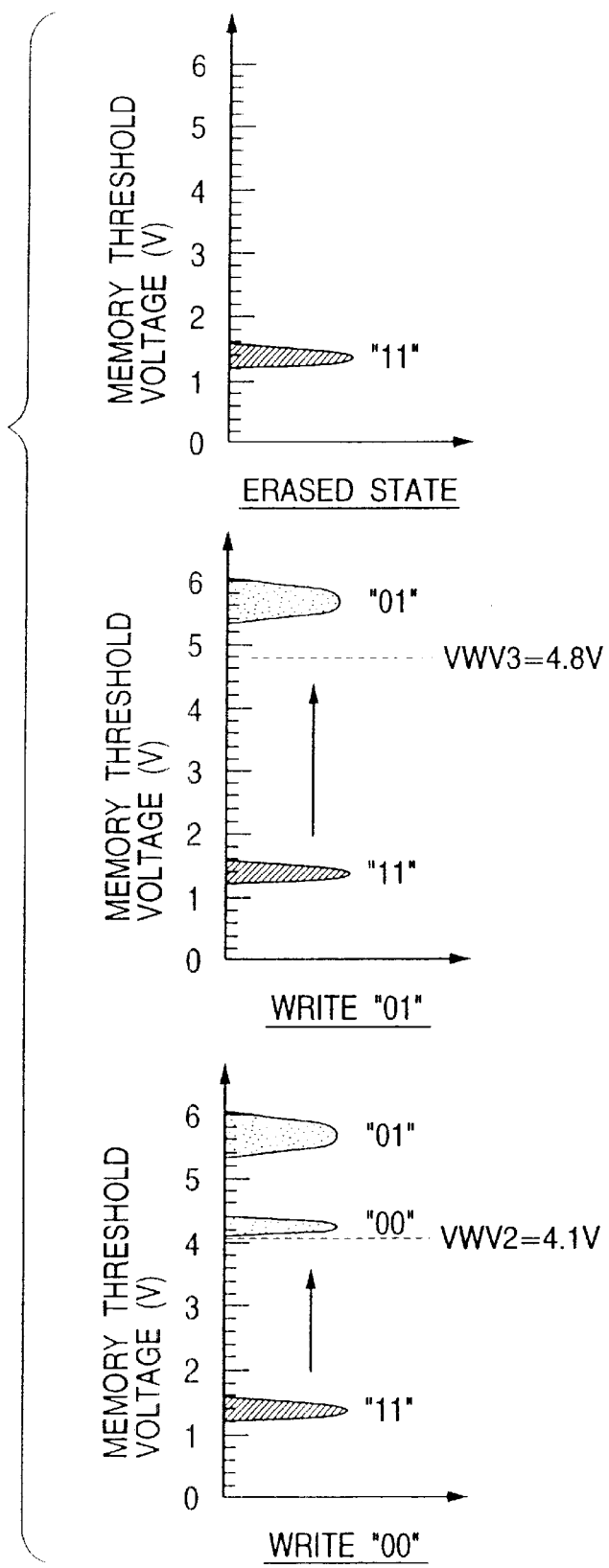

FIG. 17 shows distribution diagrams of threshold voltages in the write operation of FIG. 15 and FIG. 16.

Figure 18:
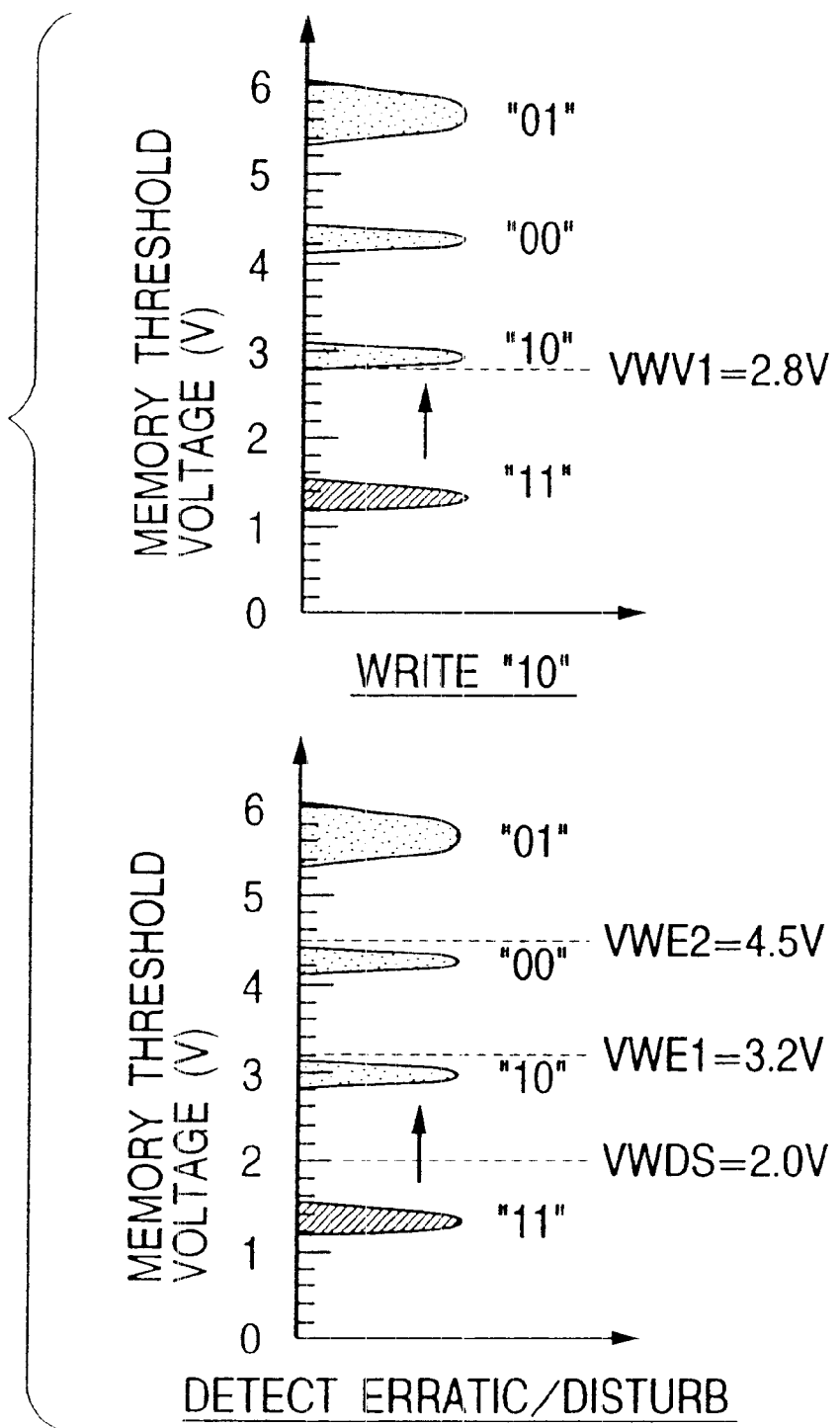

FIG. 18 shows distribution diagrams of threshold voltages in the write operation of FIG. 15 and FIG. 16.

Figure 19:
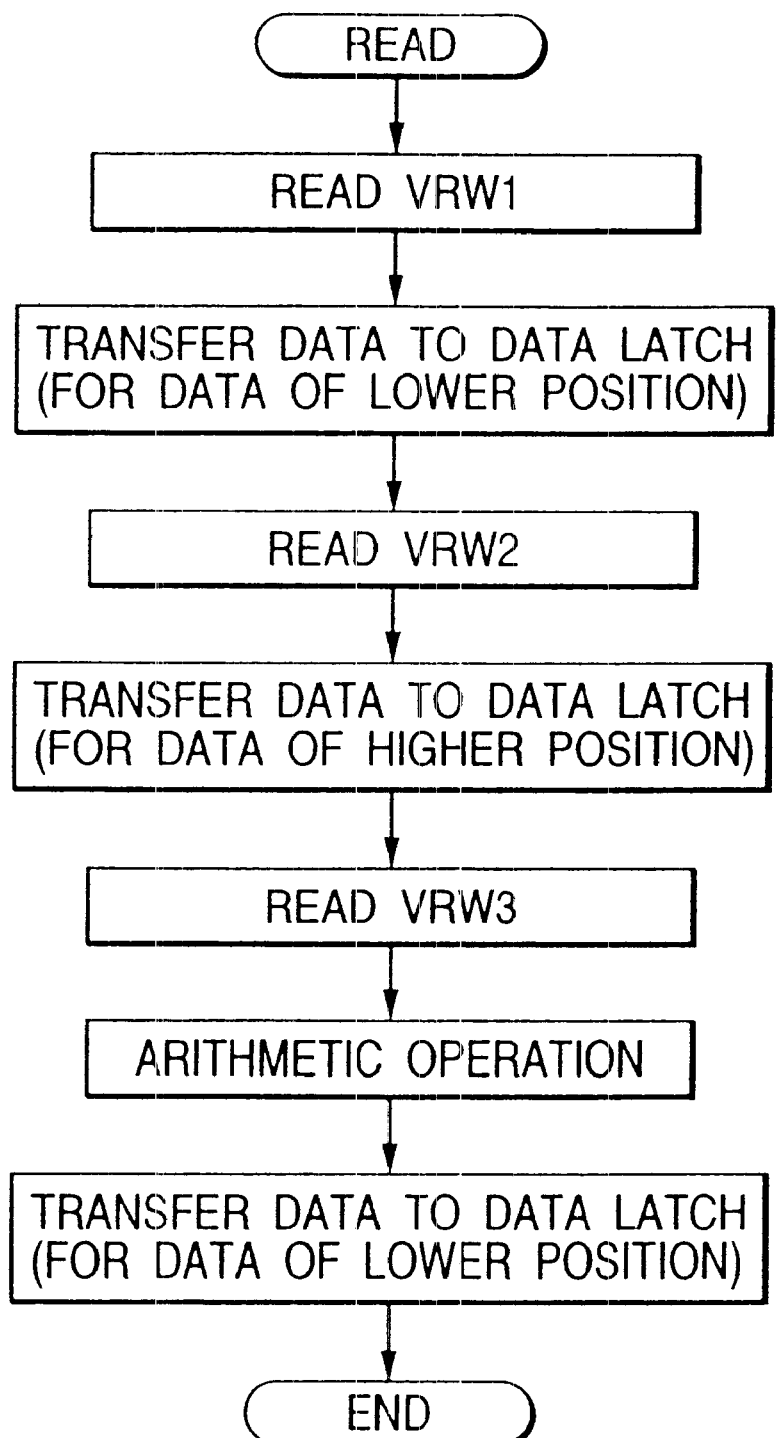

FIG. 19 is a partial flow chart for describing a read operation in the non-volatile memory embodying the invention.

Figure 20:
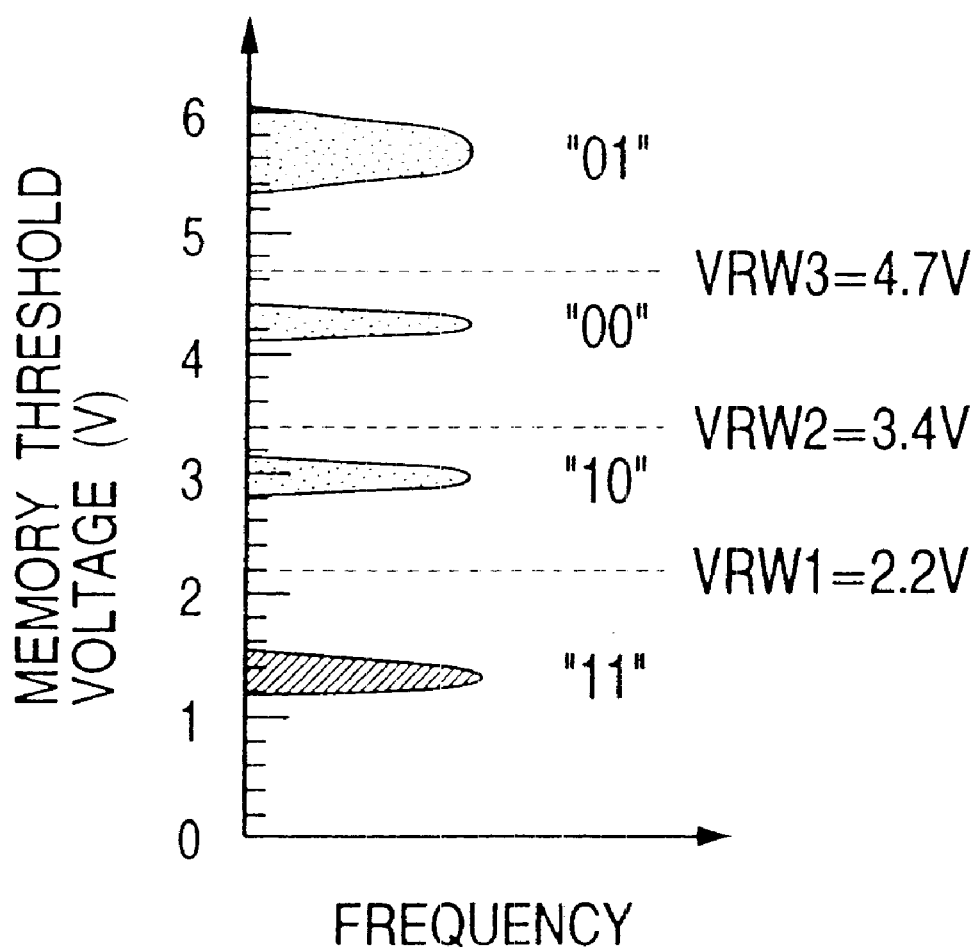

FIG. 20 is a distribution diagram of threshold voltages in the read operation of FIG. 19.

Figure 21A:
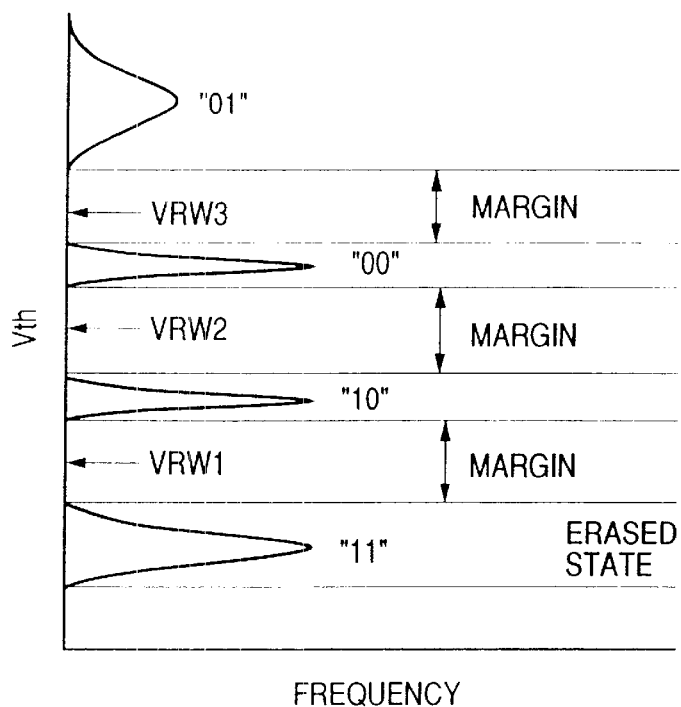
Figure 21B:
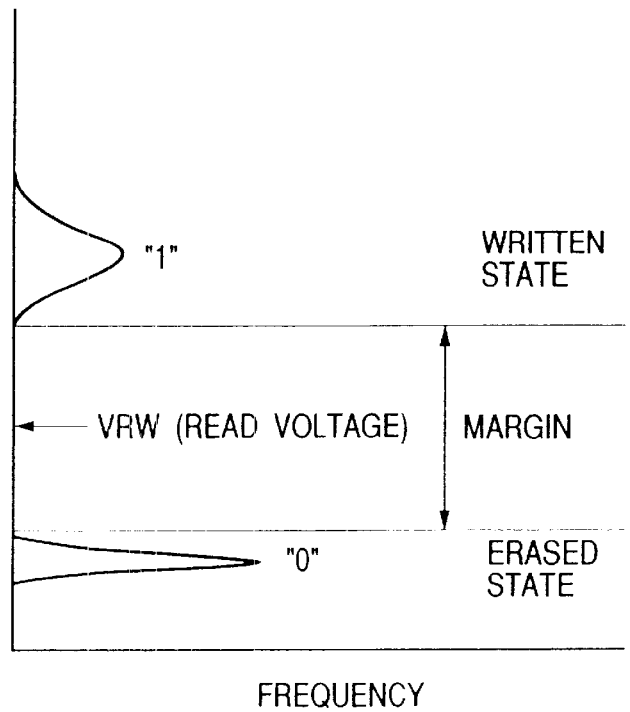

FIGS. 21(A) and 21(B) are distribution diagrams of threshold voltages for describing a storage state in the non-volatile memory embodying the invention.

Figure 22:
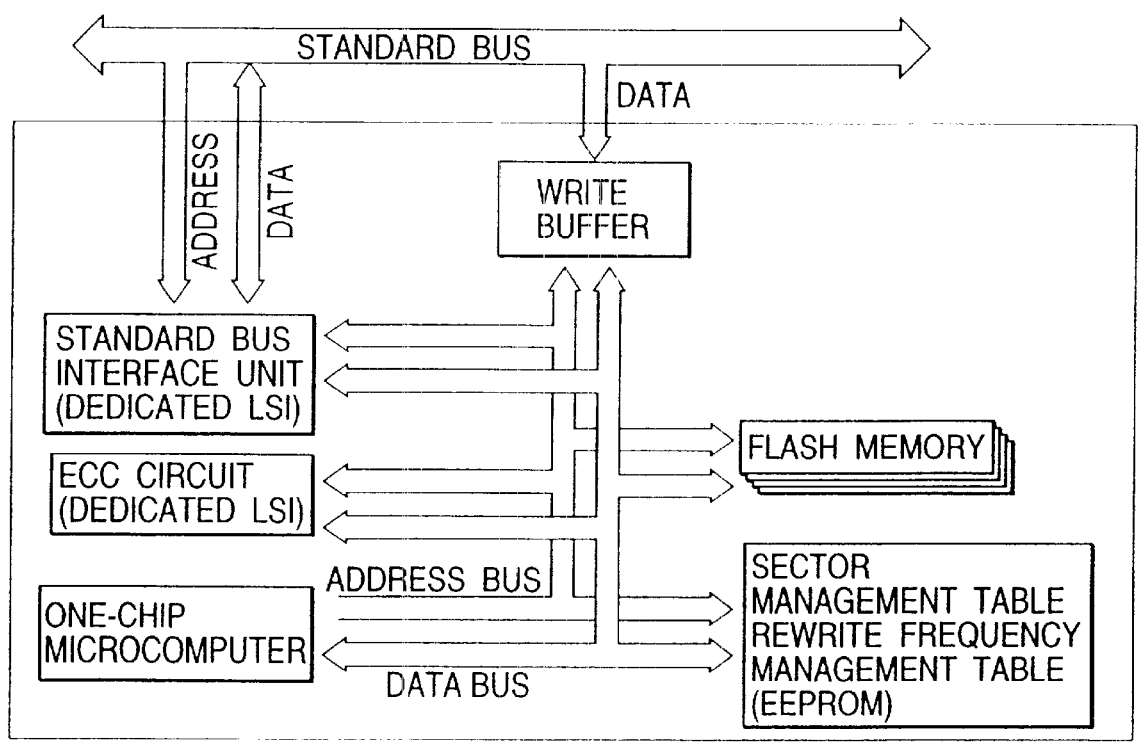

FIG. 22 is a block diagram of an example of memory unit using a flash memory according to the invention.

Figure 23:
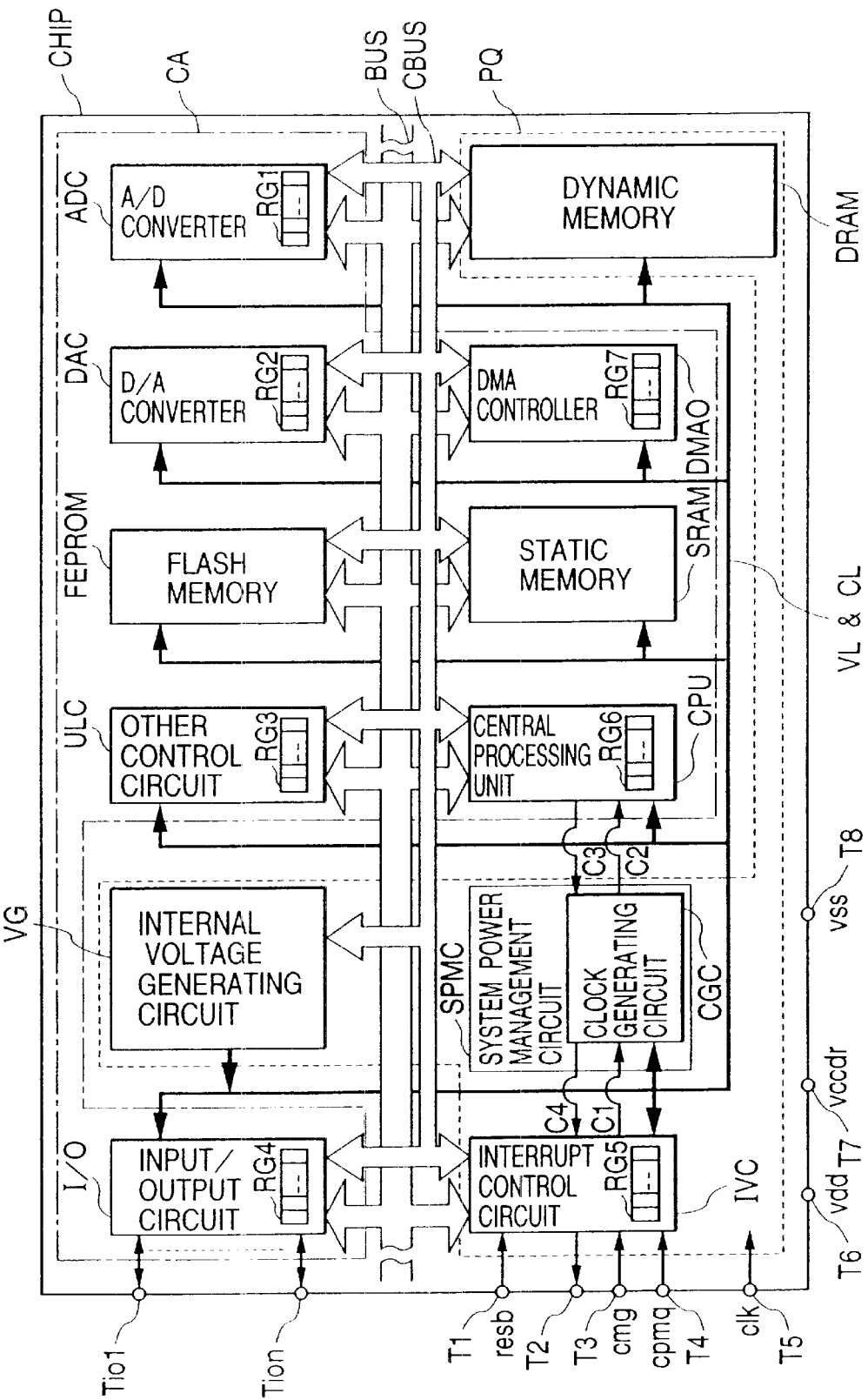

FIG. 23 is an overall block diagram of another semiconductor integrated circuit system embodying the invention.

Figure 24:
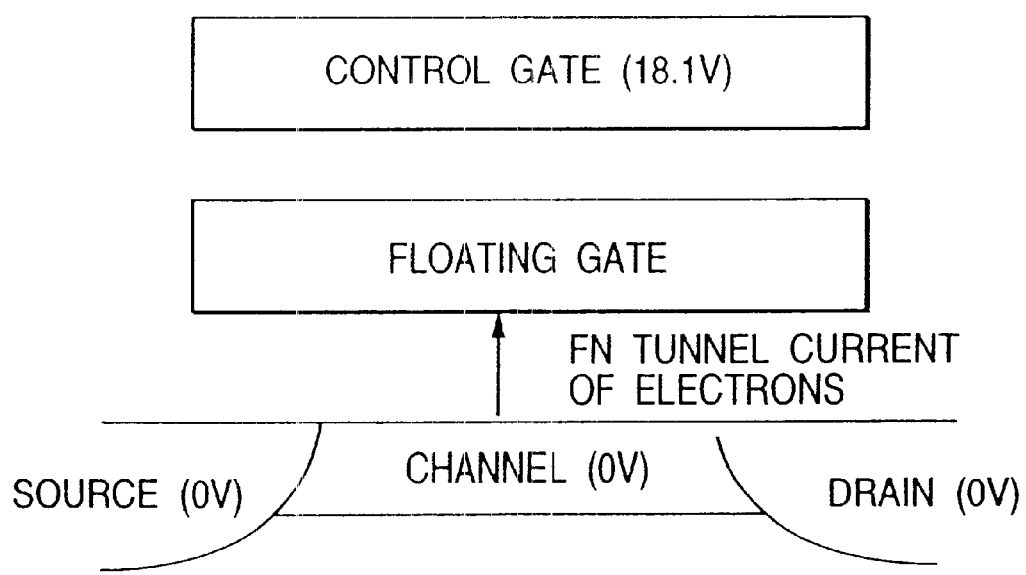
Figure 25:
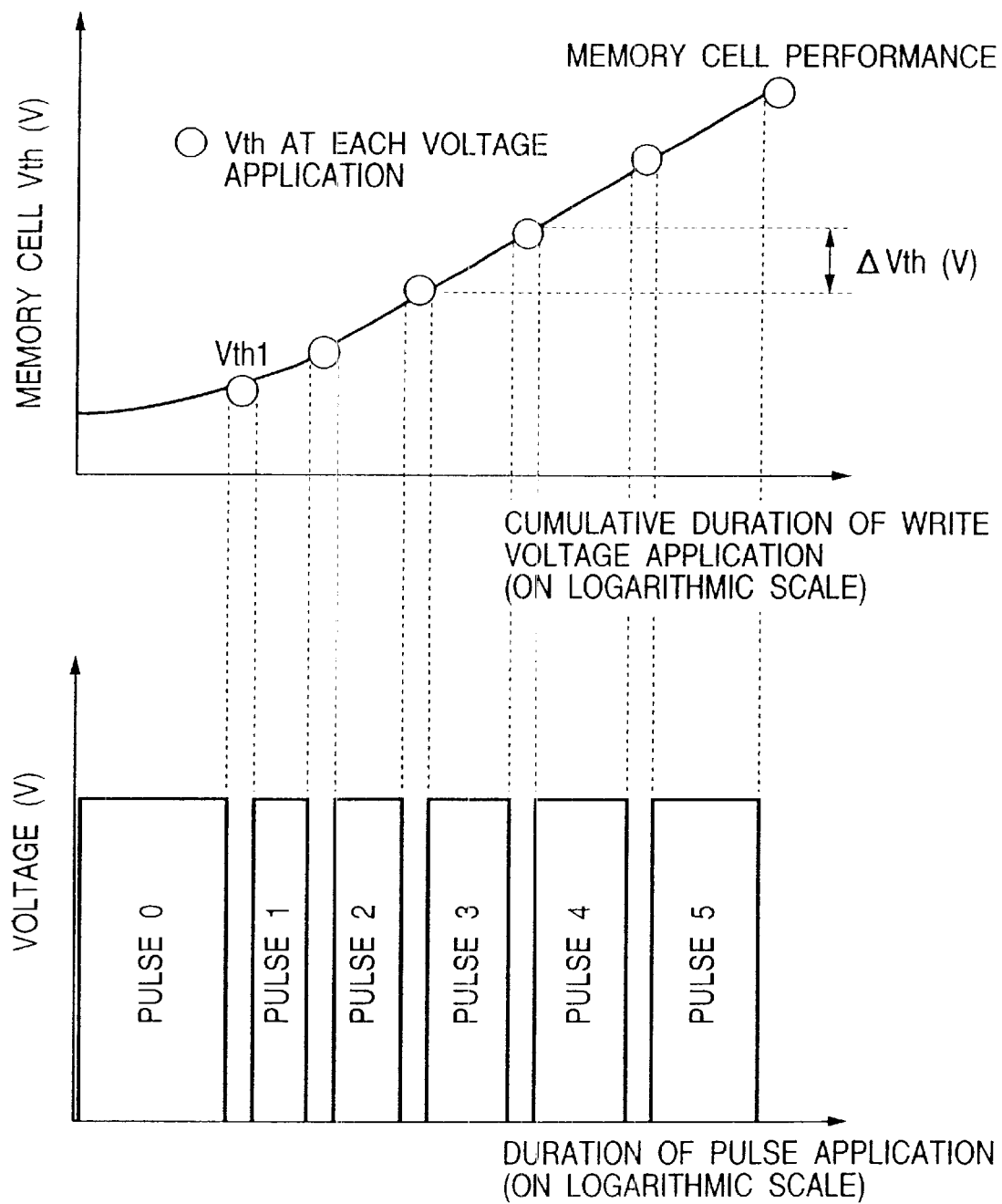

FIG. 24 is a configurational diagram for describing the write operation of the flash memory FIG. 25 is a diagram for describing an example of method of non-volatile memory programming for a multi-value flash memory developed prior to the present invention

DESCRIPTION OF THE PREFERRED EMBODIMENTS

Figure 1:
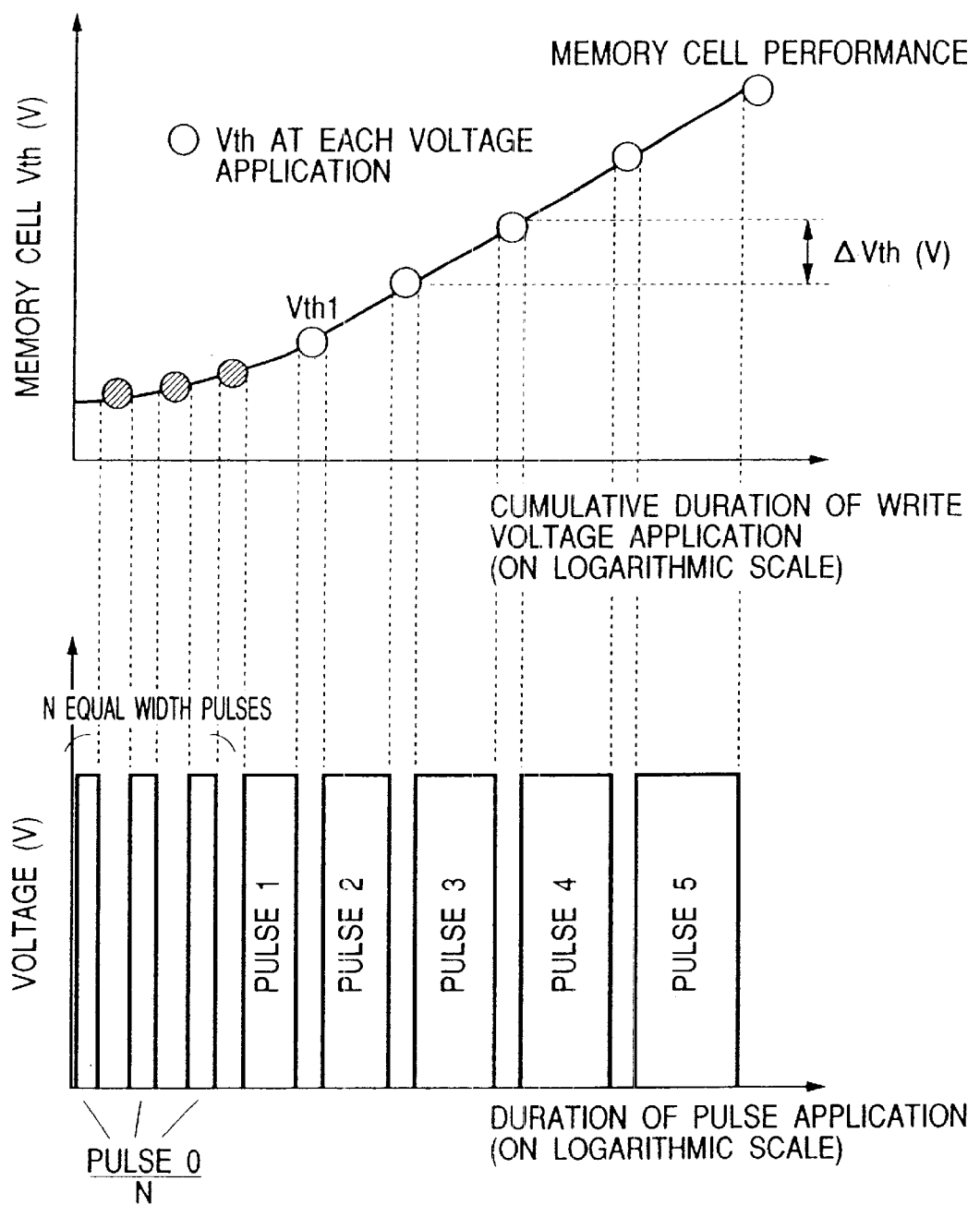
FIG. 1 is a diagram for describing a method of non-volatile memory programming, which is an embodiment of the present invention.

FIG. 1 illustrates a method of non-volatile memory programming, which is an embodiment of the present invention. Here are shown a memory cell performance representing the relationship between the cumulative duration of write voltage application (on a logarithmic scale) and the memory cell Vth and the pulse waveform of write operation corresponding thereto.

In this non-volatile memory embodying the invention, writing operation is done sector by sector (memory cells connected to the same word line constitutes one sector) using an FN tunnel phenomenon. In this embodiment, such a write formula, using typical write characteristics of memory cells, as will make the $\Delta$Vth of memory cells substantially constant in a single write operation by adjusting the duration of voltage application while keeping the write voltage constant (pulse application duration power ratio formula). Thus, write pulses PULSE 1 through 5 . . . are so applied to cause the variant $\Delta$Vth of the threshold voltage Vth at each time of voltage application, marked with a white circle, to vary substantially equally.

The duration of application is so designed with respect to the $\Delta$Vth that the Vth be accommodated within a certain target control range by a plurality of write operations, with various coefficients of dependence taken into consideration. However, since some memory cells deviate from such typical write characteristics of a memory (normal memory cells) as rewriting is repeated and excess writing is suddenly done into them (erratic cells), and the Vth of memory cells into which erratic writing has occurred will surpass the target control range. As they are, they will be treated as cells into which faulty writing has taken place.

The pulse application duration power ratio formula takes account of only the write characteristics of typical memory cells in controlling the $\Delta$Vth, but does not anticipate the existence of erratic cells having excess write characteristics. The voltage reached when writing into memory cells is dependent on the pulse width and the voltage, and the smaller the pulse width, or the lower the voltage, the smaller the threshold voltage variant $\Delta$Vth per write operation. Thus even a memory cell with excess write characteristics can be caused to give a threshold voltage variant $\Delta$Vth close to that of a memory cell having typical write characteristics if the pulse width or the voltage is reduced. However, if the variant $\Delta$Vth per write operation is set to be suitable for erratic cells having such excess write characteristics as mentioned above, the number of operations to write into typical memory cells will increase enormously, and this would be impractical.

In view of these problems, it was thought to utilize the excess write characteristics of erratic cells and to perform only at the beginning of writing write operations to perform write operations for checking whether or not a given memory cell has the excess write characteristics, i.e. to perform search write operations. According to this embodiment, when write operations are to be performed from an erased state, the search write operations are carried out by which the write voltage is kept unchanged and N write pulses PULSE 0 whose width is reduced to 1/N are applied. In such search write operations, a threshold voltage variation of the aforementioned $\Delta V$th is caused to take place under typical write characteristics of the memory cell by N times of write operations.

Accordingly, for a memory cell having typical write characteristics, when writing is to be started from an erased state, first N times of search write operations are carried out, and along with them the Vth is varied by a minute voltage, approximately $\Delta V$th/N, at a time as indicated by hatched circles, ultimately reaching a Vth marked with a white circle (Vth1). After that, according to the pulse application duration power ratio formula described above, control is performed by $\Delta V$th at a time. By this method of non-volatile memory programming, a plurality of search writing operations are inserted only when writing is to be started from an erased state, and therefore any substantial increase in the time taken by writing into memory cells having typical write characteristics can be avoided.

For such erratic cells as were referred to above, the Vth can be held within the target control range by one or more search write operations, and the occurrence of errors can be thereby prevented. To add, since excess write characteristics are not constant, it is conceivable that the Vth surpasses the target with only one search writing, or the Vth fails to reach the target even with N times of search writing, and the next writing by the pulse application duration power ratio formula causes the Vth to surpass the target to invite an error. In the event of such an error, though the available remedy is not necessarily limited to this, the contents may be once erased and rewriting is done as described above. If the sector is found again faulty, it can be identified to be a faulty sector, and writing can be done into another sector.

Figure 2:
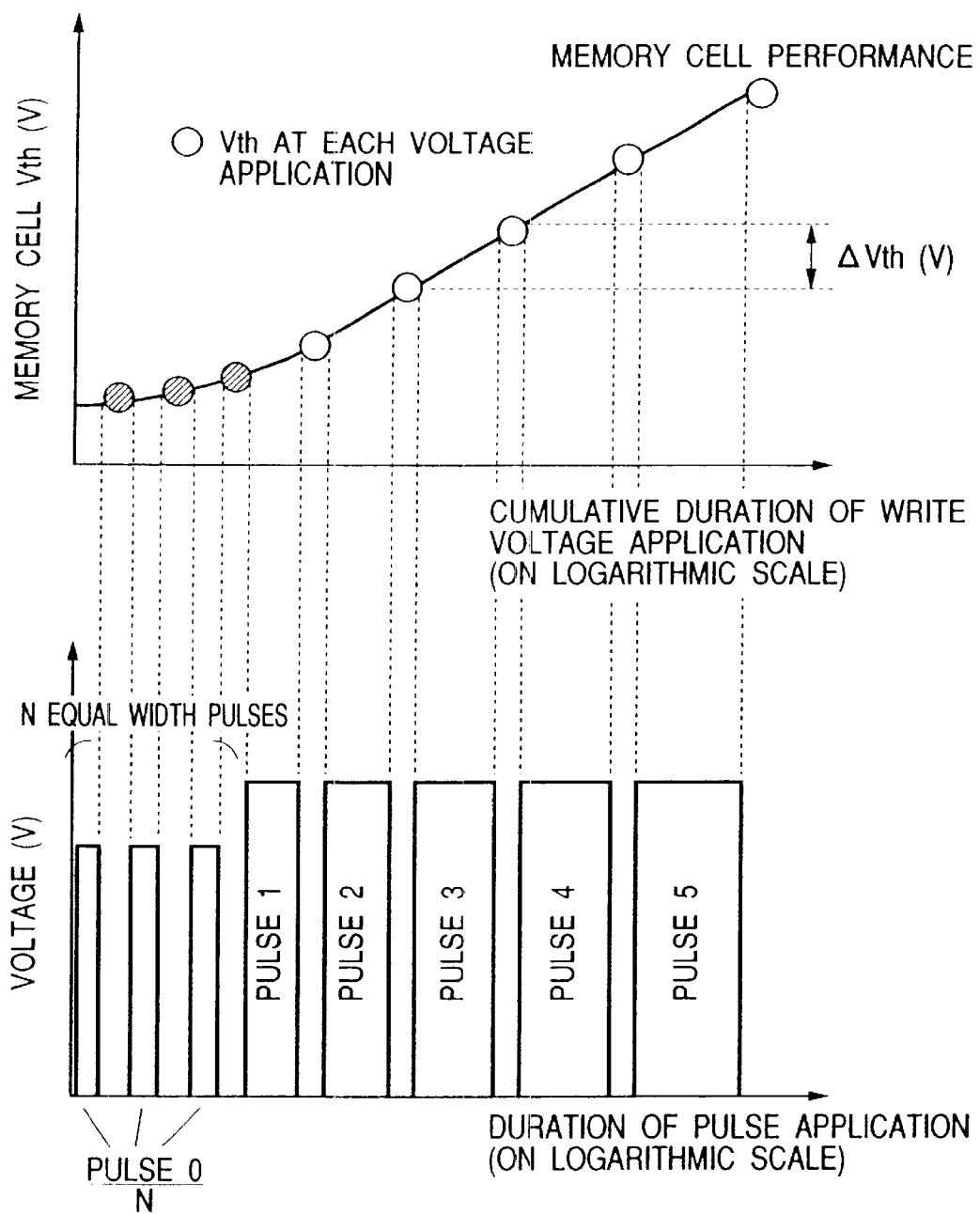
FIG. 2 is a diagram for describing a method of non-volatile memory programming, which is another embodiment of the invention.

By adopting the method of non-volatile memory programming embodying the invention in this way, the Vth can be contained within the target control range by one or more search write operation for some erratic cells, so that write operations can be generally stabilized, and the frequency of fault occurrence the frequency of fault occurrence can be reduced and the convenience of use improved while shortening the substantial length of time required for writing FIG. 2 is a diagram for describing a method of non-volatile memory programming, which is another embodiment of the present invention. In FIG. 2, the memory cell performance relationship between the cumulative duration of write voltage application (on a logarithmic scale) and the memory cell Vth and the pulse waveform of write operation corresponding thereto.

In this embodiment, as in the foregoing embodiment, the write voltage in search write operations performed when a writing operation is carried out from an erased state is kept lower than the write voltage according to the pulse application duration power ratio formula, and N write pulses PULSE 0 of 1/N in width are applied. In such search write operations, the N write operations cause a threshold voltage variation of the aforementioned $\Delta V$th to take place under typical write characteristics of the memory cell.

Figure 3:
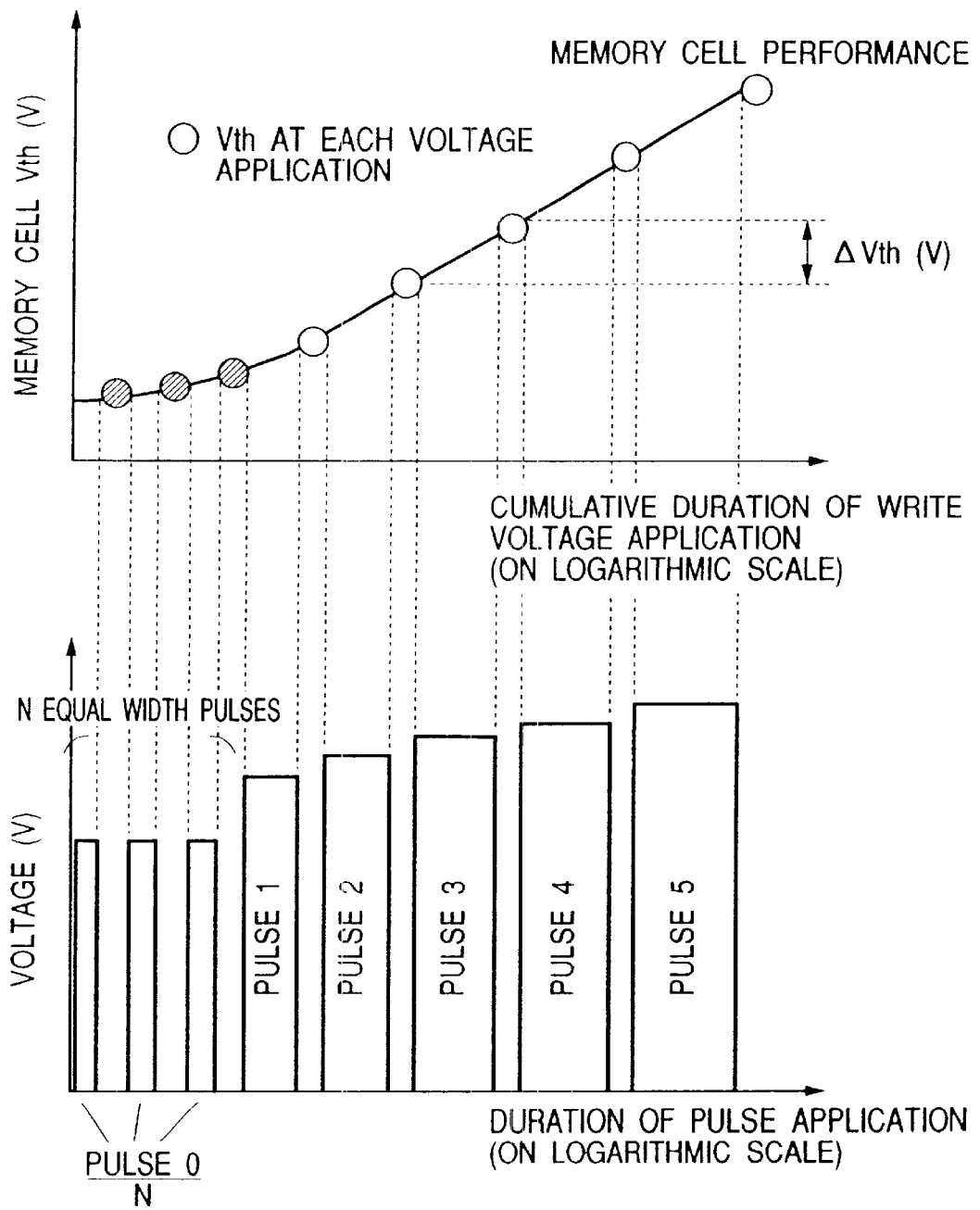
FIG. 3 is a diagram for describing a method of non-volatile memory programming, which is still another embodiment of the invention.

FIG. 3 is a diagram for describing a method of non-volatile memory programming, which is still another embodiment of the invention. The diagram shows the memory cell performance relationship between the cumulative duration of write voltage application (on a logarithmic scale) and the memory cell Vth and the pulse waveform of write operation corresponding thereto.

Figure 4:
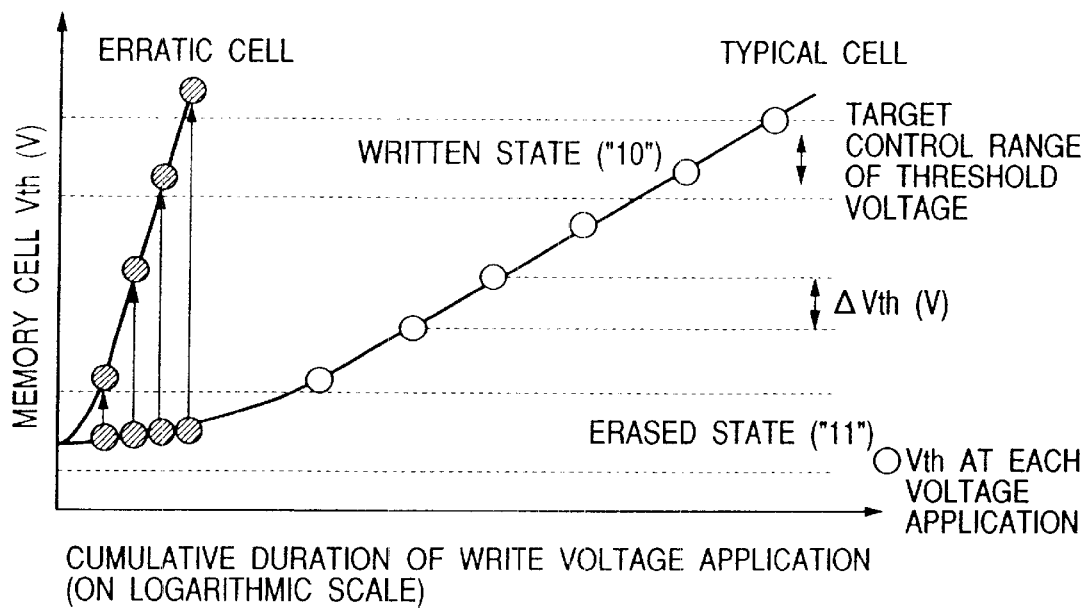
FIG. 4 is a characteristics diagram for describing a method of non-volatile memory programming according to the invention

In this embodiment, as in the foregoing embodiment, the write voltage in search write operations performed when a writing operation is carried out from an erased state is kept lower than the subsequent write voltage, and N write pulses PULSE 0 of 1/N in width are applied. In such search write operations, the N write operations cause a threshold voltage variation of the aforementioned $\Delta V$th to take place under typical write characteristics of the memory cell. In the subsequent write operations, the write quantity determined by both the write voltage and the pulse application duration, i.e. the product voltage and time, is gradually increased by a power formula, instead of the pulse application duration power ratio formula. FIG. 4 is a characteristics diagram for describing a method of non-volatile memory programming according to the invention. The diagram illustratively shows the write characteristics of typical memory cells and the write characteristics of erratic memory cells. By the methods of non-volatile memory programming shown in FIGS. 1 through 3 above, four search write operations are performed when a memory cell is turned from an erased state ("11") into a written state ("10"). As the pulse width and the pulse voltage are small in these search write operations as stated above, the variation in Vth at a time for a typical memory cell is extremely small.

However, since the Vth variation of an erratic cell having excess write characteristics with the above-described search write operations is so great as to be comparable with the $\Delta V$th in usual write operations, the target written state ("10") can be achieved by, for instance, only three write operations. On the other hand, a normal cell can be similarly turned into the written state ("10") by four search write operations followed by five usual write operations. To add, the aforementioned erratic cell is susceptible only to excess write operations, but is no different from a normal cell in data holding performance.

Figure 5:
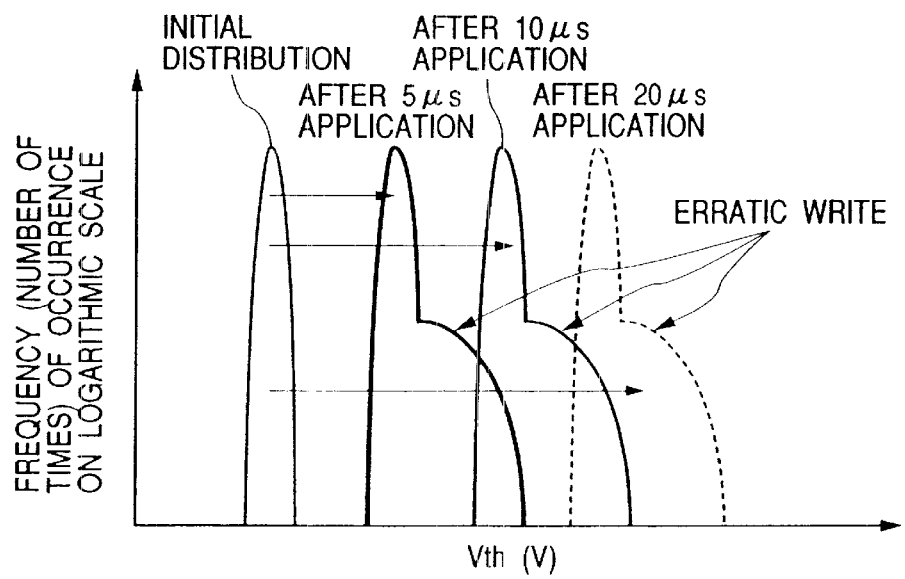
FIG. 5 is a characteristics diagram for describing the write characteristics of the non-volatile memory according to the invention.

FIG. 5 is a characteristics diagram for describing the write characteristics of the non-volatile memory according to the invention. The diagram shows threshold voltage distributions after application for 5 $\mu$s, after application for 10 $\mu$s application and after application for 20 $\mu$s to the initial distribution (erased state). Distributions for erratic writing vary in parallel correspondingly to the write durations 5 $\mu$s, 10 $\mu$s and 20 $\mu$s. This reveals that the excess writing into erratic cells can be controlled with the write duration. In view of such excess write characteristics, search write operations in this embodiment can be accomplished under as effective control even against erratic write characteristics as for write characteristics or typical memory cells by setting the pulse width, which represents the write duration, smaller that for the usual write operations.

FIG. 6 comprises another pair of characteristics diagrams for describing the write characteristics of the non-volatile memory according to the invention. FIG. 6(A) shows the threshold voltage distribution after applying the write voltage for 5 $\mu$s with the initial threshold voltage distribution (erased state) lowered, and FIG. 6(B) shows the threshold voltage distribution after applying the write voltage also for 5 $\mu$s with the initial threshold voltage distribution raised. Against erratic write distributions, too, the frequency of erratic writing is reduced by keeping the distribution higher.

For this reason, in the search write operations, for instance by also keeping the write voltage lower than in the embodiment of FIG. 1, as in those of FIG. 2 and FIG. 3, the distribution range of threshold voltage variation at a time is narrowed, and it is made possible to raise the probability of making it the Vth target to be attained by search writing. Thus the rate of erratic failure occurrence can be further reduced.

In this way, erratic cells become dependent on the pre-writing voltage level, and the frequency of erratic writing falls. In other words, the excess write characteristics of erratic cells depend on the voltage applied to memory cells, and the higher that voltage, the higher the frequency of erratic write occurrence. By reducing the voltage as in the above-cited embodiments of FIG. 2 and FIG. 3, the probability of achieving the desired Vth target for the erratic cells can be enhanced.

According to the above-described method of non-volatile memory programming, by the first write operation from the erased state, write pulses of too narrow a width to ride on the write characteristics of typical memory cells are applied. Thus, by carrying out search write operations in which pulses of an equal width, which is too narrow to ride on the power ratio curve, are applied N times to reduce the frequency of erratic writing, the voltage which erratic writing can reach is kept low. Then, after easing the voltage working on the memory cells, the process shifts to the usual power ratio application formula to make it possible to reduce the time taken to write into normal cells and write operations oriented to band narrowing.

FIG. 7 is a block diagram of a non-volatile memory, which is an embodiment of the present invention. Each circuit block in the diagram is formed over a single semiconductor substrate, made of monocrystalline silicon for instance, by a known semiconductor integrated circuit manufacturing technique.

In this embodiment, in order to reduce the number of external terminals, commands to designate the operation mode and X (row) address signals are also taken in via data terminals I/O (0–7). Thus, input signals entered via input/output buffers 39 are delivered via internal signal lines to a command decoder 31, a data converting circuit 20 and the address counter ACNT of a relief circuit 40. The data converting circuit 20, having a multiplexing function, supplies the X address signals via signal lines (not shown) to X decoders (X-DEC) 13a and 13b of the memory array in addition to its main function of data conversion.

The address counter ACNT, used mainly for relieving bit lines, compares a defective address stored in a redundancy fuse circuit with a Y address formed by the address counter ACNT and, if they are found identical, the relief circuit switches over to a standby bit line. The address counter ACNT is an address generating circuit for that purpose. The leading edge address may as well be entered into the address counter ACNT from an external terminal. However, where reading/writing is performed word line by word line (in sector units) as in the case of the above-described hard disk memory, there is no sense in entering the leading edge value of the Y address as mentioned above.

In FIG. 7, illustration is omitted for the signal route over which the Y address signal is delivered as that for the aforementioned X address signal. The Y address signal is delivered to a Y decoder (Y-DEC) 11, where a Y selection signal is formed. Control operations including the above-described separate channeling of input signals are accomplished with control signals supplied to a control signal input buffer & input/output control circuit 38 (e.g. a chip enable signal CE, a write enable signal WE, and output enable signal OE and a command enable signal CDW) and a clock signal SC. There is a reset signal RES, and a low power consumption mode in which no operation takes place is selected when the reset signal is at a low level. A ready/busy circuit R/B makes known the state of use of the multi-value flash memory to an external access unit.

The address (sector address) signal is decoded by the X decoders (X-DEC) 13a and 13b to select one word line WL on either a memory mat MAT-U (upper side) or a memory mat MAT-D (down side). In this embodiment, a sense latch circuit SL containing the Y gate is provided between these two memory mats MAT-U and MAT-D, though the arrangement is not limited to this one. There are two memory mats, the upper side memory mat MAT-U and the down side memory mat MAT-D, divided by the sense latch circuit SL.

Word line drivers (W-DRIVER) 14a and 14b to select word lines to which memory cells are to be connected in response to a main word line selection signal and a gate selection signal formed by the X decoder (X-DEC) have output circuits for outputting the selection/non-selection level matching each operation mode, because the electric potentials of a main word line, which is connected to the gate of a selecting MOSFET and of a word line connected to the control gate of a memory transistor to be described below are uneven, differing from mode to mode, in the write, erase and read operations. The voltages matching these operating modes are formed by an internal voltage generating circuit 37 comprising an internal power source further comprising a reference power source, a charge pump voltage raising circuit and a voltage lowering circuit, a voltage switching circuit and a voltage control circuit 371 for controlling them.

In the memory array mats MAT-U and MAT-D, memory transistors are provided at intersections between word lines and bit lines as shown in FIG. 9. Each of the bit lines is in a hierarchical structure comprising a global bit line GBL and a local bit line LBL to which and the global bit line GBL the drains of a plurality of memory transistors are commonly connected via a drain selecting MOSFET as shown in FIG. 10, though the structure is not limited to this one. The sources of these memory transistors constituting a single subblock are connected to a common source line via a source selecting MOSFET.

One subblock has 128 sectors (128 word lines) from sector 1 through sector 127, though the number is not limited to this, and the memory mats MAT-U and MAT-D together, as a memory area, are usually provided with 16384 sectors (word lines) though the number is not limited to this. Each of the memory mats MAT-U and MAT-D is provided with 245 word lines (sectors) used as a management area, though the number again is not limited to this.

In order relieve any defect on any word line, redundant word lines (sectors) are further added. Therefore, the X address signal for word line selection comprises nine bits, from X0 through X8. According to the above-described formula by which the X address signal is entered from data terminals DQ0 through DQ7, two cycles are spent to take in such an address signal comprising X0 through X8.

In the Y direction, 512×8=4096 bit lines are provided as a regular array, though the number is not limited to this, and a plurality of bit lines are additionally provided as a redundant array as mentioned above. Since each of the memory mats MAT-U and MAT-D is provided with about 4M memory transistors and four-value (two-bit) memory information is stored in each of the altogether about 8M memory transistors, information totaling approximately 16M bytes (128M bits) of information can be stored.

The bit lines are connected to the sense latch SL. This sense latch SL, as stated above, combines the function to read and sense the high level and the low level of the bit lines and that to latch them. This sense latch circuit SL is also provided with the function of a register. As this sense latch circuit SL, a circuit similar to a CMOS sense amplifier used in a known dynamic RAM, to be described afterwards, is used, though the choice is not limited to this. Thus, the sense latch circuit SL comprises a pair of CMOS inverter circuits whose inputs and outputs are so connected as to cross each other and a plurality of power switches for providing operating voltages and circuit grounding voltages to the CMOS inverter circuits. Data latches DL, provided at the other ends of the bit lines for four-value reading and writing.

Column selection by the column decoder (Y-DEC) 11 is accomplished by connecting the input/output node of the sense latch circuit SL to an input/output line with a selection signal formed by decoding an address signal formed by the address counter ACNT. The redundancy circuit 41 and the relief circuit 40 function to switch any defective bit line of the regular array of the memory mats to a standby bit line provided on the redundant array. The address counter ACNT counts serial clock signals SC supplied from an external terminal, and generates the address signal. The write data inputted serially are inputted in synchronism with the serial clocks SC, and the read data outputted serially are outputted in synchronism with the serial clocks SC. A clock generating circuit 34 various internal clock signals including the serial clocks SC.

In this embodiment, if erasing, writing and reading are performed with each word line as one sector, control with a usual mass storage controller, such as a hard disk controller (HDC), is facilitated, and the architecture of a memory system is simplified. Compatibility with file memories, such as a hard disk memory, is ensured, and replacement by them is facilitated.

Writing into, reading from and erasion of data in memory cells, including write verification to be described below, are accomplished by a command decoder 31, a control circuit (sequencer) 32, a status & testing circuit 35 and a write/erase determining circuit 33.

In this embodiment, as many data latch circuits DL for storing write data and read data as the sense latch circuits SL are arranged on both sides of the up and down memory mats MAT-U and MAT-D, and the data latch circuits DL and the sense latch circuits SL are connected by bit lines. In read operations, they are used for buffer memories and multi-value determination. Signal paths are provided to supply data transferred from the sense latch circuits SL to the data latch circuits DL to main amplifiers (MA) 36. These signal paths include column switches like those provided for the sense latch circuits SL, so that the data are serially transferred to the main amplifiers MA.

FIG. 8 is a block diagram of a non-volatile memory embodying the present invention in another way. In this embodiment, circuit blocks of the non-volatile memory are represented as broadly functional blocks, wherein memory arrays (MEMORY) are provided on two sides with a sense latch circuit (Sense Latch) in-between. On the other sides of the memory arrays farther from the sense latch circuits are arrange data latch circuits (Data Latch). Out of the data held by these data latch circuits four bits of data are read at a time via main amplifiers (Main Amp), and eight-bit data in total are read out of the main amplifiers on the two sides are outputted from external terminals I/O (0–7) via a data output buffer (Dout Buff).

Using an internal voltage generated by an internal voltage generating circuit (INTERNAL POWER), a sequencer is configured of a CPU (processor) and a microprogram ROM ($\mu$ROM) to carry out a series of operations including erasing and erase verifying, writing and write verifying, search writing according to the present invention and its verifying. For controlling this sequencer, control signals CE, WE, CDE, OE, RES and SC together with commands entered from external terminals I/O (0–7) are used. In FIG. 8, illustration of the X addresses (sector addresses) supplied to the X decoder (X-DEC) for selecting word lines on the memory arrays, an address counter for generating Y addresses supplied to the Y decoder included in the sense latch circuit, and the address signal supply path are omitted.

FIG. 11 shows schematic cross sections of element structures in storage transistors used in a non-volatile memory embodying the present invention. FIG. 11(A) shows what has an asymmetric SD (source and drain) diffusion layer, in which LOCOS constitutes an element separation area. FIG. 11(B) uses Sgi for element separation, and the source and drain are configured of a symmetric LDD diffusion layer.

FIG. 12 is a circuit diagram illustrating an example of a memory array section centering on a sense latch circuit SL of a non-volatile memory embodying the present invention. In FIG. 12, as similar circuits configured in mirror symmetry with a sense latch circuit in-between, the lefthand side of them (what corresponds to the above-described down side memory array MAT-D, for instance) is illustrated as an example.

The sense latch circuit comprises a CMOS latch circuit further comprising a P-channel type MOSFET and an N-channel type MOSFET, and a source voltage and an operating voltage, such as a circuit grounding potential, are provided by a power switch MOSFET turned on by a sense latch activating signal (not shown) to the common source SLP of the P-channel type MOSFET and the common source SLN of the N-channel type MOSFET.

A pair of input/output nodes of the sense latch circuit SL are connected via selecting MOSFETs under switching control with selection signals TRL and TRR to the global bit lines of two memory arrays sandwiching it. In FIG. 12, the global bit line G-BLL among the global big lines is shown as an example. The left side input/output node of the sense latch circuit SL is connected to the matching global data line G-BLL of the left side memory array by the rise of the internal signal TRL to a prescribed high level and the turning-on of the selecting MOSFET.

Each latch circuit is put into an operating state by a high level and a low level of operating voltages SLP and SLN, respectively, and when the word line shown here is selected; amplifies read signals outputted from selected memory cells of the memory mat via the matching global data line G-BLL; determines and holds their logical values. When in writing operation, a write flag or a write forbid flag, generated on the basis of write data and verify result taken into the unit data latch of the data latch DLL and DLR (not shown) and indicating whether or not the matching memory cell is the cell to be written into, is held.

The sense latch circuit SL further includes two N-channel MOSFETs provided in series between an internal voltage supply point FPC and the matching global data line G-BLL of the memory array and another N-channel MOSFET provided between the internal voltage supply point FPC and the global data line G-BLL. Of these, one of the MOSFETs connected in series is supplied with an internal signal PCL at its gate, and the other of the MOSFETs connected in series is coupled at its gate to the left side input/output node of the matching latch circuit. The gate of the remaining one MOSFET is supplied with an internal signal PRCL.

The internal voltage supply point FPC is selectively supplied with an internal voltage which is given a prescribed potential according to the operating mode of a multi-value flash memory, and an internal signal PCL (PCR) controls the selective precharging of bit lines (global bit lines; the same applies hereinafter) and the arithmetic operation of bit line data of the data held by the sense latch circuit while an internal signal RPCL (RRCR) controls the collective precharging of bit lines. Here, (PCR) and (RPCR) denote control signals matching bit lines on the right hand side, which are not illustrated.

The data latch circuit DLL is provided so as to match the global data line G-BLL of the memory array. As in the case of the sense latch circuit SL, the CMOS latch circuit and the source of a P-channel MOSFET constituting such a latch circuit are supplied with an operating voltage when they are placed in an operating state, and the source of an N-channel MOSFETN is operated with a grounding potential VSS when it is placed in an operating state. The right hand side input/output node of the data latch circuit is coupled to the matching global data line G-BLL via an N-channel type selecting MOSFET. The gate of the selecting MOSFET of each data latch circuit DLL is supplied with an internal signal DTL.

This causes the right hand side input/output node of the data latch circuit DLL to be selectively connected to the matching global data line G-BLL as the internal signal DTL is given a prescribed high level to turn on the selecting MOSFET. Each latch circuit is placed in an operating state by the supply of an operating voltage to the DLPL and that of a grounding potential VSS to the DLNL, and takes in and holds, for instance, write data supplied from a multiplexer MX via a Y gate circuit (not shown).

The data latch circuit DLL further includes N-channel MOSFETs provided in series between an internal voltage supply point FPC and the matching global data line G-BLL and another N-channel MOSFET provided between the internal voltage supply point FPC and the right hand side input/output node of the latch circuit. Of these, one of the MOSFETs connected in series is supplied with an internal signal PCDL at its gate, and the other of the MOSFETs connected in series is coupled at its gate to the right side input/output node of the matching latch circuit. The gate of the remaining one MOSFET is supplied with an internal signal RPDL. The signal PCDL controls the arithmetic operations of the data of the data latch circuit DLL and of the data of bit lines, and the signals RPDL and RDLL perform discharging and precharging of the input/output nodes of the data latch circuit DLL.

A word driver forms a selection voltage to be supplied to word lines to which the control gates of the memory transistors are connected. This selection voltage is set to a plurality of levels matching the verify operations for reading, writing and erasing, respectively. For instance, VRW 1 through 3 are read voltages, used for distinguishing the four threshold voltages of the memory transistors. VWW is a write voltage, which can be varied at a plurality of steps VWV 0 through 3 are write verify voltages; VWE 1 through 2, write erratic detection voltages; VWDS, a write disturb detection voltage; VWE, an erase voltage; and VEV, an erase verify voltage.

The operation of the non-volatile memory according to the present invention will be described below. FIG. 13 is a flow chart for describing an erase operation, and FIG. 14 comprises distribution diagrams of threshold voltages in the erase operation. In the erase operation, a negative high voltage is applied to the word lines, and an FN tunnel current of electrons accumulated at the floating gate are let flow from the floating gate to the substrate side via the gate insulating film to discharge the electrons at the floating gate.

In this erase operation, erase verify 1 is carried out first. Thus, a read operation is performed with the word line voltage set to VEV=1.6 V and, if the threshold voltage of the memory transistors is no higher than 1.6 V, it means an erased state. Therefore, the erase operation is ended without doing anything. If at least one of the memory transistors matching the word lines is on, an erase operation is performed. Thus, a negative high voltage of −16 V, for instance, is applied to the word lines, and an FN tunnel current of electrons accumulated at the floating gate are let flow from the floating gate to the substrate side via the gate insulating film to discharge the electrons at the floating gate.

This is followed by erase verify 2. This erase verify 2 is the same as the erase verify 1. A read operation is performed with the word line voltage set to VEV=1.6 V, and the erase operation and erase verify are repeated until the threshold voltage of the memory transistors comes down to 1.6 V or below. Since such an erase operation is repeated collectively in word line units involving an erased state or memory transistors already brought into an erased state, the distribution of threshold voltages in the erased state ("11") becomes relatively broad as shown in FIG. 14(A). Therefore, processing for deplete prevention to narrow the distribution of threshold voltages to the erased state ("11") is carried out as illustrated in FIG. 14(B).

Upon completion of the collective erase operation as described above, deplete detection is carried out. In this deplete detection, with the word line voltage set to VWV0=1.2 V, and the erase operation is ended unless there is any memory transistor whose threshold voltage is no higher than that. If there is even one memory transistor not greater than the 1.2 V, write bit setting is performed correspondingly, and a write word line voltage of 18.1 V, as mentioned above, is applied to a designated word line, i.e. the control gate of the memory transistor into which writing is to be done, and a write voltage of, for instance, 0 V is applied its drain, i.e. channel. Since this writing is intended for minute writing back, the write voltage need not be high.

This causes, in the memory transistor to be written into, an FN tunnel phenomenon to take between its control gate and channel, and electrons are injected from the channel into the floating gate, whose threshold voltage rises as a result. Further, to the drain, i.e. channel, of a memory cell which is coupled to a designated word line and not to be written into, a write forbid voltage of, for instance, 5 V is applied to compress the voltage between its control gate and channel, so that no FN tunnel phenomenon arises and the threshold voltage of the memory cell varies either.

Repetition of such write verify VWV0 for writing (writing back) raises the threshold voltages of memory transistors having undergone the deplete detection to VWV0=1.2 V as stated above. Then, erased state ("11") word disturb detection takes place and, with the word line voltage being set to VWDS=2.0 V, the threshold voltages of the memory transistors are confirmed to be no higher than the disturb voltage VWDS=2.0 V to end the erase operation. If at least one memory transistor is found to be above the threshold voltage of VWDS=2.0 V, it is regarded as having undergone defective erasion (abnormally ending), and switching to another sector takes place as required.

FIG. 15 and FIG. 16 are flow charts for describing a write operation, and FIG. 17 and FIG. 18 are distribution diagrams of threshold voltages in the write operation. FIG. 16(A) show details of "01" writing in FIG. 15, and FIG. 16(B), details of "00" writing in FIG. 15.

The operation to write into the multi-value flash memory in this embodiment begins with a write bias operation on a memory transistor whose post-writing target is the highest fourth threshold voltage, i.e. a "01" cells. This write bias operation on the "01" cells is accomplished by the above-described search write operation, usual write operation and the verify operation (VWV3=4.8 V) for each. Thus, as shown in FIG. 16(A), data latch is processed according to whether the data latch circuit matching the "01" cells is written into or not and, though illustration is omitted in FIG. 16(A), a write operation with a relatively large pulse width, e.g. 100 $\mu$s, is performed after a plurality of search write and verify operations as described above.

Since this writing into the "01" cells is satisfactory if the threshold voltage is VWV3=4.8 V, the time taken for writing is reduced by using a relatively large pulse width of 100 $\mu$s and thereby increasing the variant $\Delta$Vth of the threshold voltage at a time. For instance, where the writing characteristics are usual, the processing is ended with two or so write operations. Thus, except for the search writing, by extending the duration of the write word line voltage from the beginning to perform writing in a relatively rough manner and reducing the required of number of verify operation to two, for instance, setting is so made that a correspondingly short duration of writing would suffice.

As shown in FIG. 15, writing into the "00" cells and the "10" cells is accomplished in the same manner as described above. Thus, though not shown, a plurality of search write and verify operations, such as the above-described ones, are inserted at the start of writing. The distributions of threshold voltages along with the writing into the "00" cells and the "10" cells have to be controlled highly precisely so that they can be contained within relatively narrow ranges as shown in FIG. 17 and FIG. 18. For example, for the "00" cells, the application time TN of write pulses (the width of the Nth write pulse) in a normal operation after the search write operation is set to be TN=1.2×(TN−1 cumulative time)−(TN−1 cumulative time). This is similarly applied to the "10" cells, too, though the processing is not limited to it. As a result, the variant $\Delta$Vth of threshold voltages is reduced, and the required number of verify operations is increased to eight, for instance, and the required duration of writing is extended to a few time as long as that for the "01" cells.

During a write operation, a word line voltage as high as 18.1 V is commonly applied to the control gates of memory transistors coupled to designated word lines of the memory array, i.e. selected word lines At this time, 0 V, 2 V and 3 V are selectively applied according to the logical value of write data to bit lines to which the drains of memory transistors to be written into (hereinafter to be referred to as write cells), out of the memory transistors coupled to the selected word lines of the memory array, namely global bit lines and local bit lines (hereinafter to be referred to as write bit lines), and a write forbid voltage of 5 V is applied to bit lines to which the drains of memory cells not to be written into (hereinafter to be referred to as non-write cell) are coupled (hereinafter to be referred to as non-write bit lines).

Accordingly, voltages of 18 V, 16 V or 15 V is applied between the control gate and channel of the "01" cells, "00" cells and "10" cells, while electrons are injected into the floating gate of each memory cell by an FN tunnel phenomenon in a quantity matching the voltage between its control gate and channel, resulting in a rise in its threshold voltage. Thus, since the threshold voltage variation can be smaller in the "00" cells than in the "01" cells and smaller in the "10" cells than in the "01" cells, the applied voltage is reduced to increase the controllability of threshold voltages and to prevent deterioration of the performance of elements.

Upon completion of the writing operations on the "01" cells, "00" cells and "10" cells, erratic/disturb detection is carried out as shown in FIG. 15 in the order of "11" cells, "10" cells and "00" cells. Thus, referring to FIG. 18, first the word line selection level for "11" cells is set to VWDS=2.0 V, and that its threshold voltage does not surpass the upper limit for the erased state (disturb) is detected, followed by similar detection, for the "10" cells and "00" cells, for which the level is set to VWE 1=3.2 V and VWE 2=4.5 V, that the threshold voltage of neither surpasses the upper limit, i.e. detection of the absence of erratic writing.

In the verify operation following search writing, writing at or above a set voltage can be detected, but writing beyond a prescribed distribution of threshold voltages cannot be detected. Therefore, erratic detection as in this embodiment is required. Upon occurrence of an error revealed by the erratic/disturb detection, an erase operation is carried out again, and a series of write operations is carried out from the "01" cells onward. If the error is determined by the erratic/disturb detection to have occurred for a second time, the writing is ended thereupon, and such a word line (sector) is determined to be defective, for instance, and switching to a standby sector take place (not shown).

FIG. 19 is a flow chart for describing a read operation, and FIG. 20 is a distribution diagram of threshold voltages in the read operation, wherein read voltages are also shown.

The operation to read out of the multi-value flash memory in this embodiment is carried with the word line selection level being set to VRW 1=2.2 V. Thus, the "11" cells in the erased state are caused to output a low level onto the bit lines, and the others, to output a high level onto the bit lines. The sense latch circuit SL determines this high level or low level on the bit lines, and transfers data to data latch circuits for data of lower positions.

Next, with the word line selection level being set to VRW 2=3.4 V, a read operation is carried out. Thus, the "11" cells and the "10" cells in the erased state are caused to output a low level onto the bit lines, and the other "00" cells and the "01" cells, to output a high level onto the bit lines. The sense latch circuit SL determines this high level or low level, and transfers data to data latch circuits for data of higher positions.

Then, with the word line selection level being set to VRW 3=4.7 V, a read operation is carried out. Thus, the "11" cells in the erased state and the "10" and "00" cells are caused to output a low level (L) onto the bit lines. Only the "01" cells are caused to output a high level (H) onto the bit lines. The sense latch circuit SL determines this high level or low level, and performs exclusive OR operations with data taken into data latch circuits. Thus, if there is coincidence between them, such as the data in the data latch circuit of a lower position being "1" or "0" and the data in the sense latch circuit SL being "1" or "0", "0" is transferred to the data latch circuit of the lower position. If there is no such coincidence, "1" is transferred to the data latch circuit of the lower position. The output signals of the data latch circuit of the lower position and the data latch circuit of the higher position are inverted, and outputted through the main amplifier MA. This results in reading in the following logic state shown in Table 1 below.

TABLE 1

| Cell | R1 | R2 | R3 | R1 * R3 | Higher position bit | Lower position bit |
|------|----|----|----|---------|---------------------|--------------------|
| "01" | H  | H  | H  | 0       | 0                   | 1                  |
| "00" | H  | H  | L  | 0       | 0                   | 0                  |
| "10" | H  | L  | L  | 1       | 1                   | 0                  |
| "11" | L  | L  | L  | 1       | 1                   | 1                  |

H and H in R1 through R3 here denote respectively the high level and the low level in the reading of VRW 1 through VRW 3, while * in R1*R3 denotes an exclusive OR operation. The four kinds of information stored in the cells, "11", "10", "00" and "10" are hereby read out data of two bits each, a higher position bit and a lower position bit.

FIG. 21 comprises distribution diagrams of threshold voltages for describing a storage state in the flash memory embodying the present invention. FIG. 21(A) illustrates an instance in which four values are stored into a single memory transistor like the one described above, and the distribution of threshold voltages matching stored information items "00" and "10" requires band narrowing to secure margins from the adjoining threshold voltages, i.e. highly precise control of the threshold voltages. For this reason, if any erratic cell as what was mentioned above emerges, it is highly likely to immediately to a faulty sector.

By contrast, in the method of non-volatile memory programming according to the invention, excess write characteristics of memory transistors are anticipated, search writing is carried out to detect such excess write characteristics, making it possible realize stable write operations while enabling stored information to take more multiple values.

Errors due to such erratic excess writing are not limited to multi-value storage, such as four-value storage. Even in two-value storage operation as shown in FIG. 21(B), the margin between the stored information items "0" and "1" is narrowed with a drop in source voltage. As the margin thus narrows with a drop in the voltage of the semiconductor memory unit, the search write operation according to the present invention is useful for ensuring stable write operation in such two-value storing non-volatile memories as well.

FIG. 22 is a block diagram of an example of memory unit using a flash memory according to the invention. For the data storage section of the memory unit in this embodiment, a flash memory such as the one in the foregoing environment is used. Data writing into and reading out of this flash memory undergo data error detection by an ECC circuit constituted of a dedicated LSI.

A sector management table is configured of an EEPROM and the like. This sector management table reads, writes and erases in word line units, each of which is treated as a sector, though the arrangement is not limited to this. During this sector-by-sector data rewriting, the number of times of rewriting (frequency of rewriting or frequency of erasing) is counted and, when the frequency surpasses a permissible limit, access to the sector is prohibited to increase reliability.

Writing into a flash memory takes a longer time than reading. Therefore, writing from a host system or the like is not done directly into the flash memory, but write data are entered into a write buffer. The write buffer has a storage capacity for one sector of the kind described above, though the capacity is not limited to this, and takes in storage data for one sector. The write data taken into the write buffer are successively written into the sense latch circuit of the flash memory byte by byte. When one sector equivalent of data has been taken into the sense latch circuit, the writing operation as described above is started.

In the reading operation, when the leading edge address is supplied to the flash memory as described above, one sector equivalent of data is serially outputted byte by byte in the order of addresses formed by an address generating circuit (address counter) within.

The write operations, read operations and the control of the sector management table described above are performed by a single-chip microcomputer. The memory unit in this embodiment is compatible with a conventional hard disk unit or a floppy disk unit, and is connected to a standard bus via a standard bus interface section. To this standard bus are connected, though not shown, a central processing unit CPU constituting a host system, a main memory and cache memories (a first cache memory and a second cache memory) among other items.

FIG. 23 is an overall block diagram of another semiconductor integrated circuit device embodying the present invention. The semiconductor integrated circuit device CHIP embodying the invention in this manner comprises a plurality of circuit blocks illustrated herein, i.e. an input/output circuit I/O, an internal voltage generating circuit VG, a control circuit ULC, a flash memory FEPROM, a D/A converter DAC, an A/D converter ADC, an interrupt control circuit IVC, a system power management circuit SPMC having a clock generating circuit CGC, a central processing unit CPU, a static memory SRAM, a DMA controller DMAC and a dynamic memory DRAM.

These circuit blocks are coupled to an internal bus BUS and a control bus CBUS. They are mounted on a semiconductor substrate (not shown) to constitute the semiconductor integrated circuit device. The system power management circuit SPMC has a function to control electric power consumed in each module mounted on a system LSI.

The semiconductor integrated circuit device has input/output external terminals Tio1 through Tion connected to an input/output circuit I/O; an external terminal T1 to which a reset signal resb, such as a negative logic level, is supplied; an external terminal T2 for control use; an external terminal T3 for a first operation for control use to which a first operation control signal cmq is supplied; an external terminal T4 for a second operation for control use to which a second operation control signal cpmq is supplied; an external terminal T5 for clock use to which an external clock signal clk is supplied; and a plurality of external terminals T6, T7 and T8 for power supply use to which a plurality of source voltages (vdd, vccdr and vss) are supplied.

The semiconductor integrated circuit device illustrated here is configured as a so-called application specified integrated circuit (ASIC). Thus, most of the circuit blocks illustrated here are designed to constitute so-called modules or macrocells as independent circuit-functional units to facilitate ASIC configuration. Each functional unit can be varied in scale and configuration. As an ASIC, those of the illustrated circuit blocks not needed by the electron system to be realized can be excluded from mounting on the semiconductor substrate Conversely, circuit blocks for functional units not illustrated here can be added.

The central processing unit CPU can be configured similarly to a so-called microprocessor, though not limited to this configuration. Thus the central processing unit CPU, though the illustration of its details is omitted, has within it, a command register, a command decoder for decoding commands written into the command register, an arithmetic circuit, a general register (RG6, etc.), and input/output circuits coupled to the internal bus BUS, including a bus driver and a bus receiver.

The central processing unit CPU reads out a command stored in the flash memory FEPROM or elsewhere, and performs an operation matching the command. The central processing unit CPU takes in external data entered via the input/output circuit I/O; inputs/outputs data to and from the control circuit ULC; reads out commands from the flash memory FEPROM and data needed for executing the commands, such as fixed data; supplies the D/A converter DAC with data to be converted; reads out data having undergone A/D conversion by the A/D converter; reads and writes data out of and into the static memory SRAM and the dynamic memory DRAM; and controls the operation of the DMA controller DMAC. The control bus CBUS is used for control by the central processing unit CPU of the operations of the circuit blocks illustrated herein, and for conveying state instruction signals from circuit blocks including the DMA controller DMAC to the central processing unit CPU. The central processing unit CPU references via the internal bus BUS operation control signals set in an instruction register RG5 or elsewhere in the interrupt control circuit IVC, and performs necessary processing.

The central processing unit CPU, receiving a system clock signal C2 generated by the clock generating circuit CGC, is periodically operated at an operational timing determined by the system clock signal C2. The main internal part of the central processing unit CPU is configured of a CMOS circuit, i.e. a circuit constituted of pMOS and nMOS. The CMOS circuit mainly constituting the central processing unit CPU includes (not shown) a CMOS static logic circuit, a statically operable CMOS static circuit such as a CMOS static flip-flop, and a CMOS dynamic circuit for performing precharging of signal output nodes and signal outputting to signal output nodes in synchronism with the system clock signal C2, though the constitution is not limited to this.

The central processing unit CPU, when the supply of the system clock signal C2 from the clock generating circuit is stopped, is suspended from operation accordingly. In the suspended state, the output signal of the dynamic circuit is varied undesirably by an undesirable leak current occurring in the circuit. Some circuits in the static flip-flop circuit configuration, such as the register circuit, hold the previous data even during the period in which no system clock signal is supplied.

During the non-supply period of the system clock signal C2, signal level transition in various nodes of the static circuits within the central processing unit CPU is suspended, and discharging and precharging in the output nodes of the dynamic circuits are also suspended. In this state, relatively large consumption currents, such as operating currents consumed by CMOS circuits in the operating state, i.e. charging and discharging currents provided from power supply lines to give signal displacements to the floating capacities and parasitic capacities which various nodes and wiring leading to each of them have are reduced substantially zero. As a consequence, the central processing unit CPU can create only a small current equal to the leak current of the CMOS circuit, resulting in a low power consumption state.

The interrupt control circuit IVC receives a reset signal, such as a negative logic level as its external terminal T1, a first operating control signal cmq via its external terminal T3, a second operation control signal cpmq via its external terminal T4, and outputs a state instruction signal to instruct the operating state of the semiconductor integrated circuit device at its external terminal T2. The interruption control circuit IVC has the register RG5 in which bits of different positions are set in response to the reset signal resb, the operation control signals cmq and cpmq and the state instruction signal, respectively. The state instruction signal in the register RG5 is updated by the central processing unit CPU via the internal bus BUS. The operation control signals cmq and cpmq set in the register RG5 via the external terminals T3 and T4, as described above, are referenced by the central processing unit CPU via the internal bus BUS.

The interrupt control circuit IVC has within it a refresh address counter (not shown) for refreshing the dynamic memory, though its configuration is not limited to this. This refresh address counter in the interrupt control circuit IVC is counted up on the basis of the system clock signal from the clock generating circuit CGC if the first and third modes are indicated by the first and second operation control signals cmq and cpmq, i.e. if the semiconductor integrated circuit device is instructed to take on either the operation mode or the operation standby mode, and forms refresh address information, which is periodically updated.

The clock generating circuit CGC, receiving an external clock signal clk via the external terminal T5, forms a system clock signal C2 having a period matching that external clock signal clk. While the signal line between the clock generating circuit clk and the central processing unit CPU is represented in a simplified form, it is expected that the system clock signal C2, like a clock signal for a usual process, is constituted of a multi-phase signal for orderly operations of circuits not shown here in the central processing unit CPU.

The input/output circuit I/O receives signals supplied from outside via a desired external one out of the external terminals Tio1 through Tion, and also receives via the internal bus BUS signals to be outputted to a desired one out of the external terminals Tio1 through Tion. The input/output circuit I/O has within it a control register RG4 and a data register not shown, each comprising a CMOS static circuit.

The control register RG4 is selected by the central processing unit CPU and provided by the central processing unit CPU with control data for the input/output circuit I/O, e.g. control data for data input/output instruction and instruction of a high-output impedance state. The data register is used for data transfers between the external terminals Tio1 through Tion and the internal bus BUS. The data register is disposed to have, where the bit width, i.e. the number of terminals, of the external terminals Tio1 through Tion differs from the bit width of the internal bus BUS, a number of bits matching the greater bit width, and converts the number of bits in accordance with operation control by the central processing unit CPU.

For instance, where the number of the external terminals Tio1 through Tion is 64 and the bit width of the internal bus BUS is a relatively large number, such as 256 bits, serial data successively supplied to the external terminals Tio1 through Tion in 64 bit units are supplied to the data register in succession under series-to-parallel data conversion control by the central processing unit CPU, and converted into 256 bit data. Conversely, 256 bit data set into the data register from the internal bus BUS are supplied in succession to the external terminals Tio1 through Tion under parallel-to-series data conversion by the central processing unit CPU.

The inputting and outputting operations of the circuit for signal inputting to and that for signal outputting from the input/output circuit I/O are controlled with the system clock signal. Accordingly, the input/output circuit I/O, like the central processing unit CPU, is placed in a low power consumption state when the system clock signal ceases to be supplied.

The control circuit ULC is provided as appropriate where the electronic system requires it. This control circuit ULC is provided where it is required by the electronic system to be realized for, e.g., motor servo control in a hard disk unit, head tracking control, error correction processing, or video and audio data compression and extension in audiovisual processing. The operation of the control circuit ULC, like that of the central processing unit CPU, is controlled with the system clock signal. The flash memory FEPROM, as described above, stores commands to be executed and fixed data read out by the central processing unit CPU.

The D/A converter DAC has a register RG2 for receiving digital data supplied via the internal bus to be converted into analog signals, and forms the analog signals on the basis of these digital data. The digital data are set into the register RG2 by either the control circuit ULC or the central processing unit CPU. Such aspects of D/A converting operations as the D/A conversion start timing and the output timing of the result of D/A conversion by the D/A converter DAC are controlled with the system clock signal. The analog signals formed by the D/A converter DAC are supplied via the internal bus BUS and the input/output circuit I/O to a desired one out of the external terminal T1 through Tn, though the supply routing is not limited to this. Incidentally, although the external terminals T1 through Tn are supposed to be combined input/output terminals (pins) here, they may be separated into input terminals and output terminals.

The D/A converter DAC, though its details are not illustrated here, is provided with a reference voltage source or a reference current source to serve as the reference for the quantity of analog data to be obtained where high precision of D/A conversion is required. Such a reference voltage source or a reference current source is deemed to constitute a kind of analog circuit, and involves the risk of consuming too great amperage to ignore in the second mode and the third mode, i.e. the full standby mode and the operation standby mode. Therefore, to enable the current consumption to be reduced in such a case, a MOSFET switch to switch off the reference voltage source or the reference current source in the second mode and the third mode is set.

The A/D converter ADC receives analog signals supplied via a desired one out of the external terminals T1 through Tn, the input/output circuit I/O and the internal bus BUS, and the start of it's a/D conversion is controlled by either the control circuit ULC or the central processing unit CPU. It converts the analog signal into digital signals under clock control conforming to the system clock signal C2, and sets the obtained digital signals into a register RG1.

The A/D converter ADC, too, like the D/A converter DAC, is provided with a reference voltage source or a reference current source to serve as the reference for the quantization level of digital conversion where high precision of D/A conversion is required. Such a reference voltage source or a reference current source again involves the risk of consuming too great amperage to ignore in the full standby mode and the operation standby mode. Therefore, in such a case, a MOSFET switch like the aforementioned one is applied to the reference voltage source or the reference current source.

The static memory SRAM, though the details of its memory cells are not illustrated, has memory cells of a configuration comprising CMOS static memory cells, i.e. a CMOS latch circuit and a pair of transfer gates MOSFETs for data inputting and outputting to and from it. CMOS static memory cells have a characteristic that they statically hold information and require only a very small operating current for holding information.

Such a static memory SRAM in substance constitutes a CMOS static random access memory. Thus the static memory SRAM has a configuration comprising a memory array comprising a plurality of CMOS static memories in a matrix arrangement; a row address decode drive circuit for decoding row address signals supplied via the internal bus BUS and thereby selecting word lines in the memory array; a column address decode circuit for decoding column addresses and thereby forming column decode signals; a column switch circuit, operated by such column decode signals, for selecting data lines in the memory array and coupling them to a common data line; an input/output circuit coupled to the common data line; and a read/write control circuit.

A circuit like such an address decode drive circuit related to the memory array, i.e. a memory array-peripheral circuit, is configured of a CMOS static circuit. Therefore, the static memory cell SRAM is placed in a relatively low power consuming state if it is only for an information holding operation involving no reading or writing. Incidentally, the CMOS static memory has a characteristic deserving particular consideration that its memory cell size tends to be relatively large and its overall size tends to be rather great relative to the storage capacity, making it difficult to give such a memory a sufficiently large capacity.

The direct memory access (DMA) controller DMAC, whose operation is controlled by the central processing unit CPU, controls on behalf of the central processing unit CPU data transfers via the internal bus BUS between circuit blocks indicated by the central processing unit CPU. Since the DMA controller DMAC can have substantially the same configuration as a DMA controller configured as an independent semiconductor integrated circuit device, no further details will be described of it, and it is only noted here that it controls data transfers on the basis of such items of set information as transfer origin information, transfer destination information and transferred data quantity information set into its internal register RG7 and the like by the central processing unit CPU.

Memory cells of the dynamic memory DRAM, i.e. dynamic memory cells, typically comprise a small number of elements, such as an information accumulating capacitor for accumulating information in the form of electric charges and a selecting MOSFET, and accordingly the memory cell size can be kept relatively small. Therefore, this dynamic memory can be composed in a relatively small overall size even though its storage capacity is great.

Since the dynamic memory DRAM can be configured in a relatively small size in spite of a large storage capacity, the semiconductor substrate on which it is mounted together with other circuit blocks can be relatively compact in size. This feature can be expected to provide other advantages. Thus, as the semiconductor substrate size affects the reliability, manufacturing yield, price and other factors which are related to the electric performance as well as thermal and mechanical stresses of the resultant semiconductor integrated circuit device, it is preferable to be small. It is made possible to provide a semiconductor integrated circuit device making possible realization of an electronic system of even superior performance by mounting a plurality of circuit blocks together with a large capacity memory on a semiconductor substrate of a relatively small size.

Where a flash memory FEPROM is mounted on a semiconductor chip, if any sector in which an erratic cell has emerged is to be immediately discarded as a defective sector, it will result in an increase in defective sectors and invite a shortage of memory capacity. Even if other circuits are normal, the increase in sector defects related to the flash memory FEPROM would make the whole system defective. By contrast, the flash memory according to the present invention, since search writing is performed which takes account of the possible erratic cells, permits writing in the same way as into normal cells even if cells with excess write characteristics emerge suddenly, making it possible to substantially reduce the occurrence of defective sectors. Since the flash memory according to the invention serves to substantially reduce the occurrence of defective sectors and moreover makes possible stable and yet fast write operations, it can be a highly useful flash memory to be mounted on a system LSI having a plurality of circuit functions.

The above-described embodiments of the invention provide the following advantages.

(1) There is provided a non-volatile memory having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information, wherein a write control circuit for controlling the electric charges accumulated at the floating gates by performing a verify operation, after performing a write operation in a prescribed write quantity on the memory elements, carries out one or more each of search write operations, set to a smaller write quantity than the prescribed write quantity at the time of start of writing, and verify operations matching thereto. This results in the advantage of stable write operations together with a reduction in the substantial duration of writing and in the frequency of defect occurrence.

(2) In addition to the foregoing, by setting the write quantity according to the product of the voltage level and the duration of writing, setting the prescribed write quantity according to such a voltage and a length of time as will make the variants of the threshold voltages of the memory elements substantially constant, and so setting the quantity of the search writing that a plurality of search write operations match the prescribed write quantity, dependable and stable write operations can be realized for cells having excess write characteristics and cells having normal write characteristics.

(3) Further in addition to the foregoing, by storing in the memory elements four-value information matching the quantity of electric charges accumulated at floating gates, a large storage capacity and stable write operations can be achieved.

(4) Further in addition to the foregoing, by controlling the prescribed write quantity by increasing the write quantity to match the number of times of writing to keep substantially constant the variant of the threshold voltage matching each write operation, dependable and stable write operations can be realized for cells having normal write characteristics.

(5) Further in addition to the foregoing, by keeping both the write voltage and write duration of the search write operations smaller than the write operations matching the prescribed write quantity, the excess write characteristics can be reduced, and accordingly the advantages of stable write operations together with a reduction in the substantial duration of writing and in the frequency of defect occurrence can be achieved.

(6) Further in addition to the foregoing, in addressing the increase in write quantity matching the number of times of writing, by increasing the write duration while keeping the write voltage constant compared with the write operation immediately before, dependable and stable write operations can be realized while simplifying the power supply circuit.

(7) Further in addition to the foregoing, in addressing the increase in write quantity matching the number of times of writing, by increasing both the write voltage and the write duration, dependable and stable write operations can be realized while easing the voltage working on the memory cells.

(8) There is provided a method of non-volatile memory programming for non-volatile memories each having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information, whereby one or more each of search write operations, set to a smaller write quantity than a prescribed write quantity at the time of start of writing, and verify operations matching thereto are performed, write operation control is so set as to perform a write operation set to the prescribed write quantity and a verify operation matching thereto after the plurality each of search write operations and verify operations, and the write operation is ended if it is so determined that the verify operation has caused a threshold voltage matching the electric charges of the floating gates of the memory elements to reach a desired threshold voltage. This results in the advantage of realizing a non-volatile memory intended to achieve stable write operations together with a reduction in the substantial duration of writing and in the frequency of defect occurrence.

(9) In addition to the foregoing, by setting the write quantity according to the product of the voltage level and the duration of writing, setting the prescribed write quantity according to such a voltage and a length of time as will make the variants of the threshold voltages of the memory elements substantially constant, and so setting the quantity of the search writing that a plurality of search write operations match the prescribed write quantity, there is achieved the advantage of realizing a non-volatile memory capable of dependable and stable write operations for cells having excess write characteristics and cells having normal write characteristics.

(10) Further in addition to the foregoing, by storing in the memory elements four-value information matching the quantity of electric charges accumulated at floating gates, there is achieved the advantage of realizing a non-volatile memory having a large storage capacity and capable of stable write operations.

(11) Further in addition to the foregoing, by controlling the prescribed write quantity by increasing the write quantity to match the number of times of writing to keep substantially constant the variant of the threshold voltage matching each write operation, there is achieved the advantage of realizing a non-volatile memory capable of dependable and stable write operations for cells having normal write characteristics.

(12) Further in addition to the foregoing, by keeping both the write voltage and write duration of the search write operations smaller than the write operations matching the prescribed write quantity, the excess write characteristics can be reduced, and accordingly there is achieved the advantage of realizing a non-volatile memory capable of stable write operations together with reducing the substantial duration of writing and the frequency of defect occurrence.

(13) Further in addition to the foregoing, in addressing the increase in write quantity matching the number of times of writing, by increasing the write duration while keeping the write voltage constant compared with the write operation immediately before, there is achieved the advantage of realizing a non-volatile memory capable of dependable and stable write operations while simplifying the power supply circuit.

(14) Further in addition to the foregoing, in addressing the increase in write quantity matching the number of times of writing, by increasing both the write voltage and the write duration, there is achieved the advantage of realizing a highly reliable non-volatile memory capable of dependable and stable write operations while easing the voltage working on the memory cells.

Whereas the invention accomplished by the present inventor has been described in specific terms with reference to preferred embodiments thereof, the invention under the present application is by no means confined to the foregoing embodiments, but it goes without saying that the embodiments can be modified in many different ways without deviating from the essentials of the invention. For instance, it is also acceptable, when a desired threshold voltage has been surpassed by search writing, to perform erratic detection and, if any defect is found, to carry out erasion immediately and, if an error is detected again, to discard the sector as being defective and to switch to a redundant sector. For the systems illustrated in FIG. 22 and FIG. 23, idle time during which the flash memory is neither written into or read out of, the sector which has been considered defective on account of an erratic cell may again be subjected to an erase operation and, if it permits satisfactory writing, the management information may be rewritten to register it as a standby sector.

The memory array and its specific circuits may be anything that permits erasion, writing and reading as described above. The storage state may be reverse to that in the foregoing embodiments. For example, the distribution of threshold voltages such as "01" and "1" in FIG. 21 and elsewhere maybe supposed to be an erased state, and the threshold voltage may be lowered in write operations to create a storage state of the remaining three values or one value. This invention can be extensively used for non-volatile memories and methods for their programming.

To briefly describe a typical advantage of the present invention disclosed in this application, there is provided a non-volatile memory having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information, wherein a write control circuit for controlling the electric charges accumulated at the floating gates by performing a verify operation, after performing a write operation in a prescribed write quantity on the memory elements, carries out one or more each of search write operations, set to a smaller write quantity than the prescribed write quantity at the time of start of writing, and verify operations matching thereto. This results in the advantage of stable write operations together with a reduction in the substantial duration of writing and in the frequency of defect occurrence.

There is also provided a method of non-volatile memory programming for non-volatile memories each having a plurality of word lines, a plurality of bit lines and a plurality of memory elements having stored information corresponding to electric charges accumulated at floating gates at the intersections of the plurality of word lines and the plurality of bit lines, and electrically performing operations to write and erase the stored information, whereby one or more each of search write operations, set to a smaller write quantity than the prescribed write quantity at the time of start of writing, and verify operations matching thereto are performed, write operation control is so set as to perform a write operation and a verify operation matching thereto set to the prescribed write quantity after the plurality each of search write operations and verify operations, and the write operation is ended if it is so determined that the verify operation has caused a threshold voltage matching the electric charges of the floating gates of the memory elements to reach a desired threshold voltage. This results in the advantage of realizing a non-volatile memory intended to achieve stable write operations together with a reduction in the substantial duration of writing and in the frequency of defect occurrence.

I claim:

1. A non-volatile memory device comprising:

a plurality of non-volatile memory cells;

a plurality of word lines each of which couples to corresponding ones of said non-volatile memory cells; and a control circuit, wherein each of said non-volatile memory cells is capable of storing multi bit data as a threshold voltage within one of a plurality of threshold voltage distributions, wherein one of said threshold voltage distributions indicates an erase state and others of said threshold voltage distributions indicate program states, and wherein in an operation of programming, said control circuit controls a plurality of program voltage supplying phases, including a first program voltage supplying phase in which said control circuit controls supplying program voltage to one of said word lines a plurality of times and verifying, and other program voltage supplying phases in which said control circuit controls supplying of program voltage to said one of word lines one time and verifying.

2. The non-volatile memory device according to claim 1, wherein periods of said supplying program voltage in said first program voltage supplying phase are equal to each other, and wherein one period of supplying program voltage in said first program voltage supplying phase is shorter than a period of supplying program voltage in maid other program voltage supplying phases.

3. The non-volatile memory device according to claim 2,
wherein voltage levels of supplying program voltage in said first program voltage supplying phase are equal to each other, and
wherein one voltage level of supplying program voltage in said first program voltage supplying phase is lower than a voltage level of supplying program voltage in said other program voltage supplying phases.

4. The non-volatile memory device according to claim 1,
wherein threshold voltage changes of memory cells in response to the supplying of program voltage in said first program voltage supplying phase are smaller than threshold voltage changes thereof in said other program voltage supplying phases.

* * * * *